United States Patent
Hwang et al.

(10) Patent No.: US 9,444,056 B2
(45) Date of Patent: Sep. 13, 2016

(54) HETEROCYCLIC COMPOUND AND ORGANIC LIGHT-EMITTING DEVICE INCLUDING THE SAME

(71) Applicant: SAMSUNG DISPLAY CO., LTD., Yongin, Gyeonggi-Do (KR)

(72) Inventors: Seok-Hwan Hwang, Yongin (KR); Young-Kook Kim, Yongin (KR); Hye-Jin Jung, Yongin (KR); Jun-Ha Park, Yongin (KR); Eun-Young Lee, Yongin (KR); Jin-O Lim, Yongin (KR); Sang-Hyun Han, Yongin (KR); Eun-Jae Jeong, Yongin (KR); Soo-Yon Kim, Yongin (KR); Jong-Hyuk Lee, Yongin (KR)

(73) Assignee: Samsund Display Co., Ltd., Yongin-si (KR)

( * ) Notice: Subject to any disclaimer, the term of this patent is extended or adjusted under 35 U.S.C. 154(b) by 364 days.

(21) Appl. No.: 14/038,612

(22) Filed: Sep. 26, 2013

(65) Prior Publication Data
US 2014/0361255 A1    Dec. 11, 2014

(30) Foreign Application Priority Data

Jun. 7, 2013    (KR) ........................ 10-2013-0065465

(51) Int. Cl.
*H01L 51/00*    (2006.01)
*H01L 51/50*    (2006.01)
(Continued)

(52) U.S. Cl.
CPC ........... *H01L 51/0072* (2013.01); *C09K 11/06* (2013.01); *H01L 51/0061* (2013.01);
(Continued)

(58) Field of Classification Search
None
See application file for complete search history.

(56) References Cited

U.S. PATENT DOCUMENTS

| 7,429,372 B2 | 9/2008 | Pez et al. |
| 2011/0260138 A1 | 10/2011 | Xia et al. |
| 2014/0124748 A1* | 5/2014 | Kim ............ C07D 403/12 257/40 |

OTHER PUBLICATIONS

Baldo, M.A. et al., "Highly Efficient Phosphorescent Emission From Organic Electroluminescent Devices", Nature, Sep. 10, 1998, pp. 151-154, vol. 395, Macmillan Publishers Ltd.
(Continued)

*Primary Examiner* — J. L. Yang
(74) *Attorney, Agent, or Firm* — Lewis Roca Rothgerber Christie LLP

(57) ABSTRACT

A heterocyclic compound is represented by Formula 1 below. An organic light-emitting device includes a first electrode, a second electrode and an organic layer between the first electrode and the second electrode. The organic layer includes the heterocyclic compound.

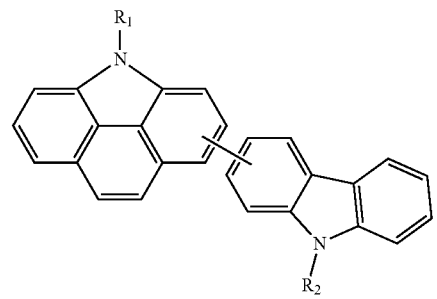

Formula 1

Organic light emitting devices including the heterocyclic compound of Formula 1 exhibit high efficiency, low voltages, high brightness, and long lifespans.

20 Claims, 1 Drawing Sheet

| SECOND ELECTRODE |
|---|
| EIL |
| ETL |
| EML |
| HTL |
| HIL |
| FIRST ELECTRODE |

(51) Int. Cl.
*C09K 11/06* (2006.01)
*H05B 33/14* (2006.01)

(52) U.S. Cl.
CPC ....... *H05B33/14* (2013.01); *C09K 2211/1029* (2013.01); *C09K 2211/1092* (2013.01); *H01L 51/0073* (2013.01); *H01L 51/0074* (2013.01); *H01L 51/0085* (2013.01); *H01L 51/0087* (2013.01)

(56) References Cited

OTHER PUBLICATIONS

Baldo, M.A. et al., "Very High-Efficiency Green Organic Light-Emitting Devices Based on Electrophosphorescence", Applied Physics Letters, Jul. 5, 1999, pp. 4-6, vol. 75, No. 1, American Institute of Physics.

Kwong, Raymond C. et al., "High Operational Stability of Electrophosphorescent Devices", Applied Physics Letters, Jul. 1, 2002, pp. 162-164, vol. 81, No. 1, American Institute of Physics.

Adachi, Chihaya et al., "High-Efficiency Organic Electrophosphorescent Devices With tris(2-phenylpyridine)iridium Doped Into Electron-Transporting Materials", Applied Physics Letters, Aug. 7, 2000, pp. 904-906, vol. 77, No. 6, American Institute of Physics.

Internet Article http://www.sigmaaldrich.com/catalog/product/aldrich/ph007423?lang=en&region=US,"4H-benzo[def]carbazole", viewed on Sep. 25, 2013, 1 page.

2009 Fall Assembly and Symposium, Gwangju Institute of Science and Technology, Oryong Hall, vol. 34, No. 2, Oct. 8-9, 2009, "A Novel Conjugated Polymer Based on 4H-benzo[def]carbazole backbone for OLED", 1 page.

* cited by examiner

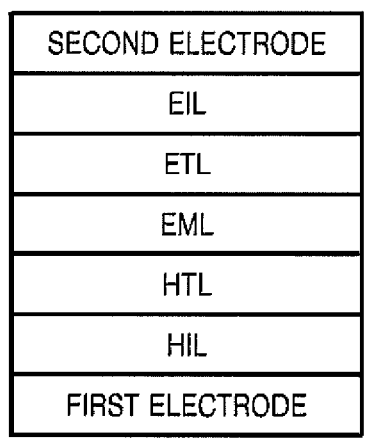

HETEROCYCLIC COMPOUND AND ORGANIC LIGHT-EMITTING DEVICE INCLUDING THE SAME

CROSS-REFERENCE TO RELATED APPLICATIONS

This application claims priority to and the benefit of Korean Patent Application No. 10-2013-0065465, filed on Jun. 7, 2013 in the Korean Intellectual Property Office, the entire content of which is incorporated herein by reference.

BACKGROUND

1. Technical Field

One or more embodiments of the present invention relate to a heterocyclic compound and an organic light-emitting device including the same.

2. Description of the Related Art

Organic light-emitting diodes (OLEDs) are self-emitting diodes having advantages such as wide viewing angles, good contrast, quick response speeds, high brightness, and good driving voltages. Also, OLEDs can provide multicolored images.

A typical diode has a structure including a substrate, and an anode, a hole transport layer (HTL), an emission layer (EML), an electron transport layer (ETL), and a cathode sequentially stacked on the substrate. The HTL, the EML, and the ETL are organic thin films formed of organic compounds.

An operating principle of an OLED having the above-described structure is as follows. When a voltage is applied between the anode and the cathode, holes injected from the anode move to the EML via the HTL, and electrons injected from the cathode move to the EML via the ETL. The holes and electrons (carriers) recombine in the EML to generate excitons. When the excitons drop from an excited state to a ground state, light is emitted.

SUMMARY

One or more embodiments of the present invention are directed to a material that has improved electrical characteristics, good charge transporting capabilities, improved emission capability, and a high glass transition temperature. These properties allow the material to be capable of preventing crystallization, making the material suitable as an electron transporting or injecting material for fluorescent or phosphorescent devices of any color, or as a red, green, blue, or white light-emitting material. An OLED that includes the material has improved characteristics, such as high-efficiency, low-voltage, high-luminance, and long-lifetime.

Additional aspects will be set forth in part in the description which follows and, in part, will be apparent from the description, or may be learned by practice of the described embodiments.

According to an aspect of the present invention, a heterocyclic compound is represented by Formula 1 below.

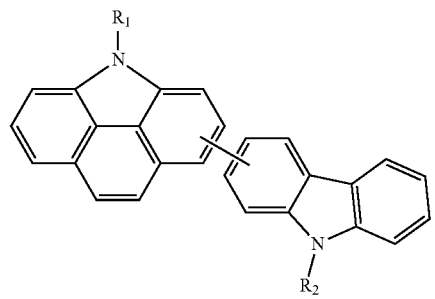

Formula 1

In Formula 1, $R_1$ and $R_2$ may each independently be a substituted or unsubstituted C1-C60 alkyl group, a substituted or unsubstituted C6-C60 aryl group, a substituted or unsubstituted C2-C60 heteroaryl group (but not pyrimidine or 1,3,5-triazine), or a substituted or unsubstituted C6-060 condensed polycyclic group.

At least one of $R_1$ and $R_2$ may be a heterocyclic compound represented by Formula 2 below.

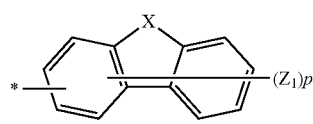

Formula 2

In Formula 2, X may be O, S, or Se. Also, p may be an integer of 1 to 7, and * may indicate a binding site to the N atom in Formula 1.

$Z_1$ may be a hydrogen atom a deuterium atom, a substituted or unsubstituted C1-C20 alkyl group, a C1-C20 alkylsilyl group, a C6-C20 arylsilyl group, a substituted or unsubstituted C6-C20 aryl group, a substituted or unsubstituted C2-C20 heteroaryl group, a substituted or unsubstituted C6-C20 condensed polycyclic group, a halogen group, a cyano group, a nitro group, a hydroxyl group, a carboxyl group, or an amino group substituted with a C6-C20 aryl group or a C2-C20 heteroaryl group.

According to another aspect of the present invention, an organic light-emitting device includes a first electrode, a second electrode, and an organic layer between the first electrode and the second electrode, and the organic layer includes the heterocyclic compound.

According to another aspect of the present invention, a flat panel display apparatus includes the organic light-emitting device, and the first electrode of the organic light-emitting device is electrically connected to a source electrode or a drain electrode of a thin film transistor.

BRIEF DESCRIPTION OF THE DRAWINGS

These and/or other aspects will become apparent and more readily appreciated by reference to the following detailed description taken in conjunction with the accompanying drawing (FIG. 1), which is a schematic view of an organic light-emitting device according to an embodiment of the present invention.

DETAILED DESCRIPTION

According to an embodiment of the present invention, a heterocyclic compound is represented by Formula 1 below.

Formula 1

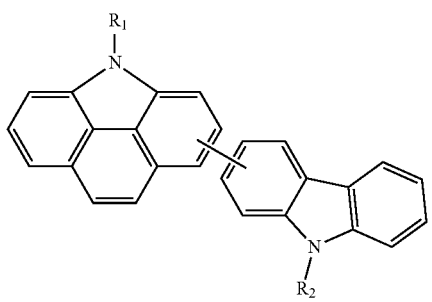

In Formula 1, $R_1$ and $R_2$ are each independently a substituted or unsubstituted C1-C60 alkyl group, a substituted or unsubstituted C6-C60 aryl group, a substituted or unsubstituted C2-C60 heteroaryl group (but not pyrimidine or 1,3,5-triazine), or a substituted or unsubstituted C6-C60 condensed polycyclic group.

At least one of $R_1$ and $R_2$ is a heterocyclic compound represented by Formula 2 below.

Formula 2

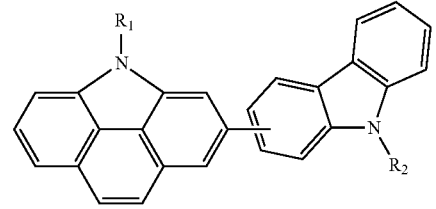

In Formula 2, X is O, S, or Se. Also, p is an integer of 1 to 7, and * indicates a binding site to the N atom of Formula 1.

$Z_1$ may be a hydrogen atom a deuterium atom, a substituted or unsubstituted C1-C20 alkyl group, a C1-C20 alkylsilyl group, a C6-C20 arylsilyl group, a substituted or unsubstituted C6-C20 aryl group, a substituted or unsubstituted C2-C20 heteroaryl group, a substituted or unsubstituted C6-C20 condensed polycyclic group, a halogen group, a cyano group, a nitro group, a hydroxyl group, a carboxyl group, or an amino group substituted with a C6-C20 aryl group or a C2-C20 heteroaryl group.

Tris(2-phenylpyridine)iridium(Ir(ppy)$_3$) is a phosphorescent material used in organic electroluminescent (EL) devices that emits a spectrum at CIE 0.30, 0.63, and its maximum power efficiency is quantum efficiency of 6%. Although organic EL devices use an "electric-phosphorescent," they have low efficiency, lifespans, and stability, and thus are not suitable for high efficiency and high quality displays. Accordingly, there is a need for the development of a phosphorescent material having high efficiency and a long lifespan at low voltage, and an organic EL device including the phosphorescent material.

The compounds represented by Formula 1 may be used as light-emitting materials or as electron transporting materials for organic light-emitting devices (OLEDs). Also, the compounds of Formula 1 have high glass transition temperatures (Tgs) or high melting points due to the introduction of the heterocycle. Accordingly, during electroluminescent light-emission, the resistance against Joule's heat between organic layers or between an organic layer and a metal electrode, and the resistance under high-temperature environments may increase. An organic EL light-emitting device (OLED) manufactured using the heterocyclic compound according to embodiments of the present invention is highly durable during storage and operation.

In some embodiments, the compound of Formula 1 may be represented by one of Formula 3 or Formula 4 below.

Formula 3

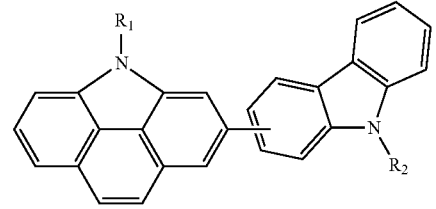

Formula 4

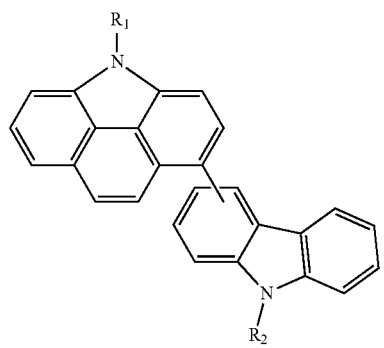

In Formulae 3 and 4, $R_1$ and $R_2$ are as described above with respect to Formula 1.

Hereinafter, the substituents of the heterocyclic compound of Formula 1 will be described.

According to an embodiment of the present invention, when one of $R_1$ and $R_2$ in Formula 1 is the heterocyclic compound of Formula 2, the other of $R_1$ and $R_2$ may be represented by Formula 2a below.

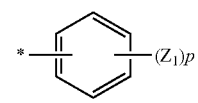

2a

In Formula 2a, $Z_1$ may be a hydrogen atom, a deuterium atom, a substituted or unsubstituted C1-C20 alkyl group, a C1-C20 alkylsilyl group, a C1-C20 arylsilyl, a substituted or unsubstituted C6-C20 aryl group, a substituted or unsubstituted C2-C20 heteroaryl group, a substituted or unsubstituted C6-C20 condensed polycyclic group, a halogen group, a cyano group, a nitro group, a hydroxyl group, a carboxyl group, or an amino group substituted with a C6-C20 aryl group or a C2-C20 heteroaryl group.

Also, p is an integer of 1 to 5, and * indicates a binding site to the N atom in Formula 1.

In some embodiments, in Formula 1, the $Z_1$ may be a hydrogen atom or a deuterium atom.

In some embodiments, in Formula 2a, the $Z_1$ may be a hydrogen atom or a deuterium atom.

Hereinafter, representative substituents from among those listed above will be defined. However, the numbers of carbon atoms listed here are non-limiting, and do not limit the properties of the substituent. Also, unless defined otherwise, the definitions of the substituents are consistent with their general definitions, as known to those of ordinary skill in the art.

As used herein, the unsubstituted C1-C60 alkyl group may be a linear or branched alkyl group, and non-limiting examples thereof include a methyl group, an ethyl group, a propyl group, an isobutyl group, a sec-butyl group, a pentyl group, an iso-amyl group, a hexyl group, a heptyl, an octyl, a nonanyl, and a dodecyl. The substituted C1-C60 alkyl group refers to the substitution of at least one hydrogen atom of the alkyl group with a deuterium atom, a halogen atom, a hydroxyl group, a nitro group, a cyano group, an amino group, an amidino group, a hydrazine, a hydrazone, a carboxyl group or a salt thereof, a sulfonic acid group or a salt thereof, a phosphoric acid group or a salt thereof, a C1-C10 alkyl group, a C1-C10 alkoxy group, a C2-C10 alkenyl group, a C2-C10 alkynyl group, a C6-C16 aryl group, or a C2-C16 heteroaryl group.

As used herein, the unsubstituted C2-C60 alkenyl group refers to an unsubstituted alkyl group having one or more carbon-carbon double bonds at a center or terminal end thereof. Non-limiting examples of the unsubstituted C2-C60 alkenyl group include ethenyl, propenyl, and butenyl. The substituted C2-C60 alkenyl group refers to the substitution of at least one hydrogen atom of the unsubstituted alkenyl group with the substituents described above in connection with the substituted alkyl group.

As used herein, the unsubstituted C2-C60 alkynyl group refers to an unsubstituted alkyl group having one or more carbon-carbon triple bonds at a center or terminal end thereof. Non-limiting examples thereof include acetylene, propylene, phenylacetylene, naphthylacetylene, isopropylacetylene, t-butylacetylene, and diphenylacetylene. The substituted C2-C60 alkynyl group refers to the substitution of at least one hydrogen atom of the unsubstituted alkynyl group with the substituents described above in connection with the substituted alkyl group.

As used herein, the unsubstituted C3-C60 cycloalkyl group refers to a C3-C60 cyclic alkyl group. The substituted C3-C60 cycloalkyl group refers to the substitution of at least one hydrogen atom of the cycloalkyl group with the substituents described above in connection with the C1-C60 alkyl group.

As used herein, the unsubstituted C1-C60 alkoxy group refers to a group represented by —OA where A is the unsubstituted C1-C60 alkyl group. Non-limiting examples of the unsubstituted C1-C60 alkoxy group include methoxy, ethoxy, isopropyloxy, butoxy, and pentoxy. The substituted C1-C60 alkoxy group refers to the substitution of at least one hydrogen atom of the unsubstituted alkoxy group with the substituents described above in connection with the alkyl group.

As used herein, the unsubstituted C6-C60 aryl group refers to a carbocyclic aromatic system having at least one aromatic ring. When the number of rings is two or more, the rings may be fused to each other or may be linked to each other via, for example, a single bond. The term 'aryl' includes aromatic systems, such as phenyl, naphthyl, or anthracenyl. The substituted C6-C60 aryl group refers to the substitution of at least one hydrogen atom of the aryl group with the substituents described above in connection with the C1-C60 alkyl group.

Non-limiting examples of the substituted or unsubstituted C6-C60 aryl group include a phenyl group, a C1-C10 alkylphenyl group (for example, an ethylphenyl group), a biphenyl group, a C1-C10 alkylbiphenyl group, a C1-C10 alkoxybiphenyl group, o-, m-, and p-tolyl groups, o-, m- and p-cumenyl groups, a mesityl group, a phenoxyphenyl group, a ($\alpha,\alpha$-dimethylbenzene)phenyl group, a (N,N'-dimethyl)aminophenyl group, a (N,N'-diphenyl)aminophenyl group, a pentalenyl group, an indenyl group, a naphthyl group, a C1-C10 alkylnaphthyl group (for example, methylnaphthyl group), a C1-C10 alkoxynaphthyl group (for example, a methoxynaphthyl group), an anthracenyl group, an azulenyl group, a heptalenyl group, an acenaphthalenyl group, a phenalenyl group, a fluorenyl group, an anthraquinolinyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthalenyl group, a heptaphenyl group, a heptacenyl group, a pyranthrenyl group, and an ovalenyl group.

As used herein, the unsubstituted C2-C60 heteroaryl group refers to a carbocyclic aromatic system having at least one ring and at least one ring heteroatom selected from nitrogen (N), oxygen (O), phosphorous (P), and sulfur (S). When the group has two or more rings, the rings may be fused to each other or may be linked to each other via, for example, a single bond. Non-limiting examples of the unsubstituted C2-C60 heteroaryl group include a pyrazolyl group, an imidazolyl group, a oxazolyl group, a thiazolyl group, a tetrazolyl group, an oxadiazolyl group, a pyridinyl group, a pyridazinyl group, a triazinyl group, a carbazolyl group, an indolyl group, a quinolinyl group, an isoquinolinyl group, and a dibenzothiophenyl group. The substituted C2-C60 heteroaryl group refers to the substitution of at least one hydrogen atom of the heteroaryl group with the substituents described above in connection with the C1-C60 alkyl group.

As used herein, the unsubstituted C5-C60 aryloxy group refers to a group represented by —OA$_1$ where A$_1$ is the C5-C60 aryl group. A non-limiting example of the aryloxy group is a phenoxy group. The substituted C5-C60 aryloxy group refers to the substitution of at least one hydrogen atom of the aryloxy group with the substituents described above in connection with the C1-C60 alkyl group.

As used herein, the unsubstituted C5-C60 arylthio group refers to a group represented by —SA$_1$ where A$_1$ is the C5-C60 aryl group. Non-limiting examples of the arylthio group include a benzenethio group and a naphthylthio group. The substituted C5-C60 arylthio group refers to the substitution of at least one hydrogen atom of the arylthio group with the substituents described above in connection with the C1-C60 alkyl group.

As used herein, the unsubstituted C6-C60 condensed polycyclic group refers to a substituent having two or more rings formed by fusing at least one aromatic ring and/or at least one non-aromatic ring to at least one other aromatic or non-aromatic ring, or to a substituent in which an unsaturated group is present in a ring but a conjugated system does not exist. The condensed polycyclic group is distinguished from the aryl or heteroaryl group in that it does not have overall aromaticity.

Non-limiting examples of heterocyclic compounds represented by Formula 1 include Compounds 1-32, below.

1
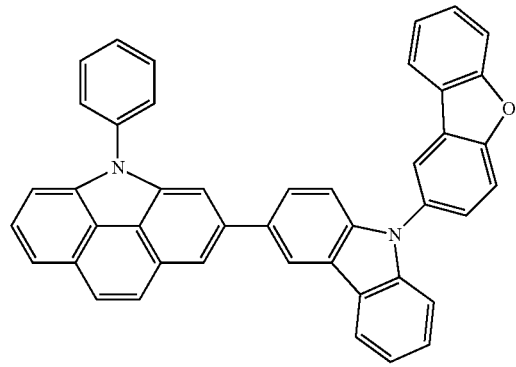
2
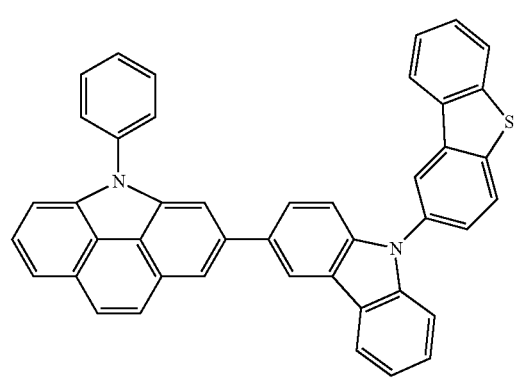
3
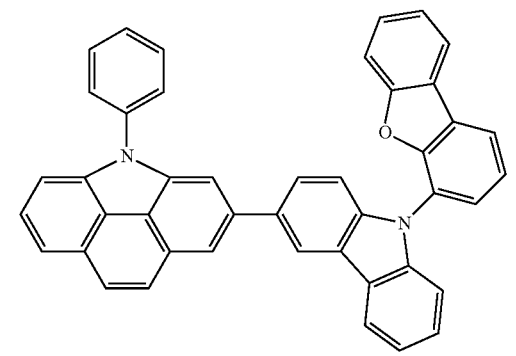
4
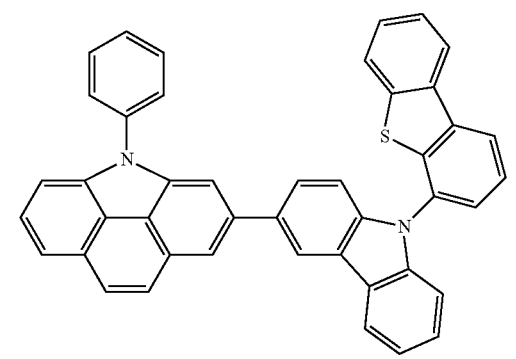
5
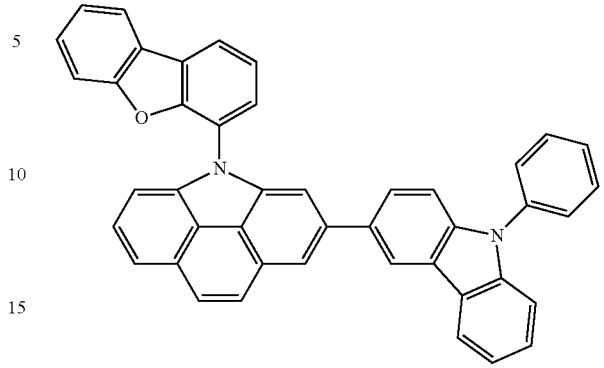
6
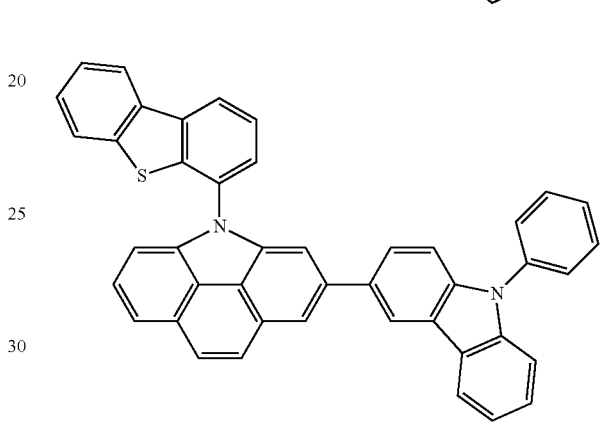
7
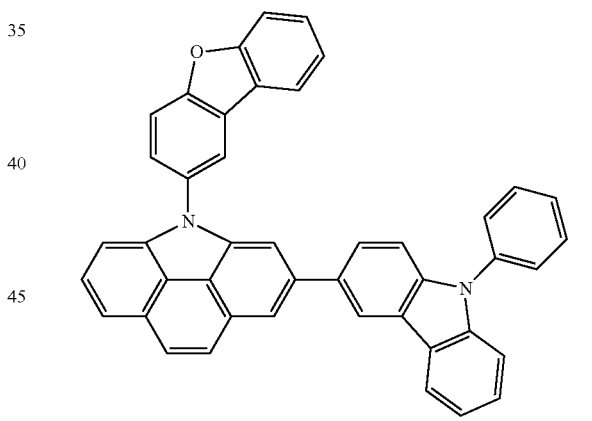
8
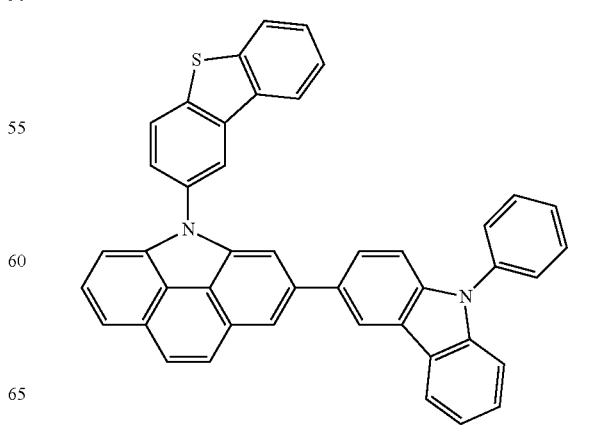

9
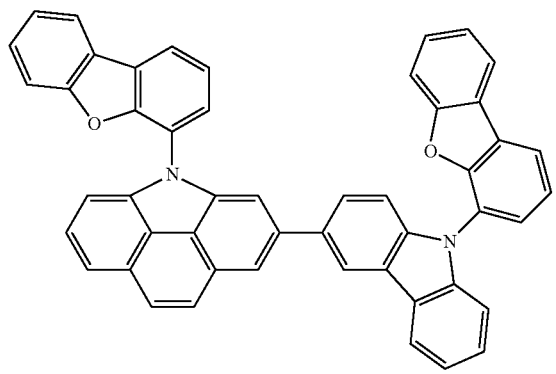
10
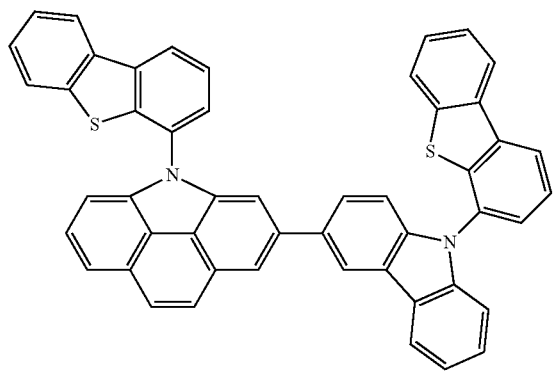
13
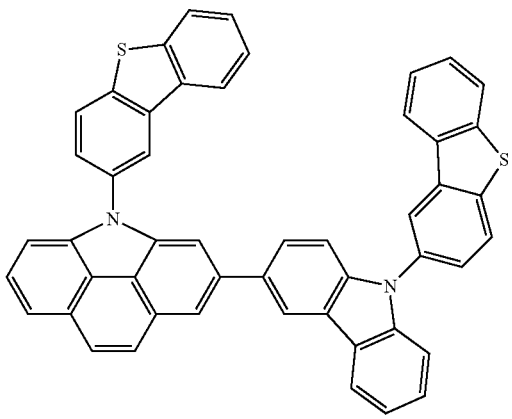
11
14
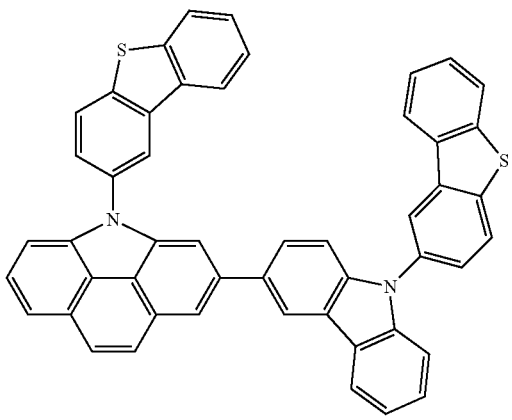
12
15
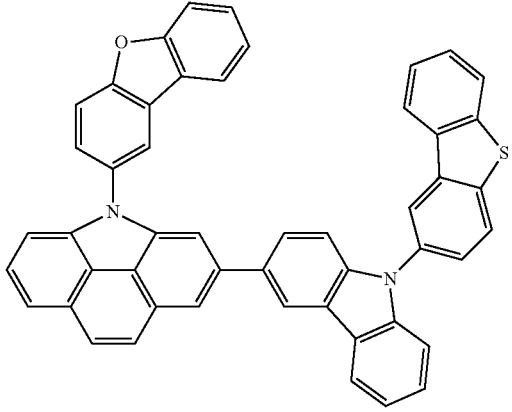

16
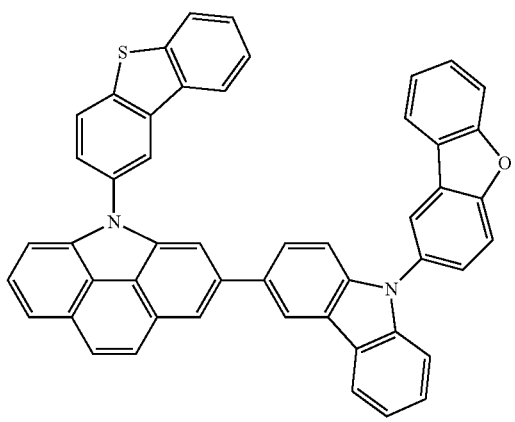
17
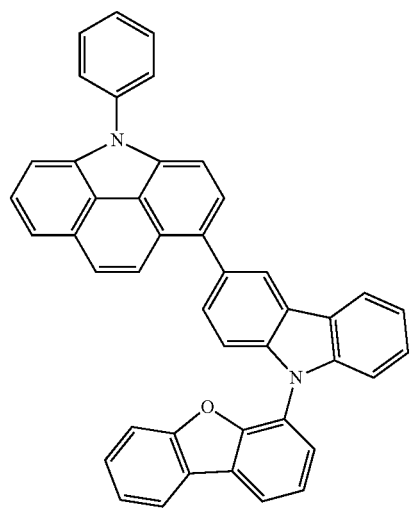
18
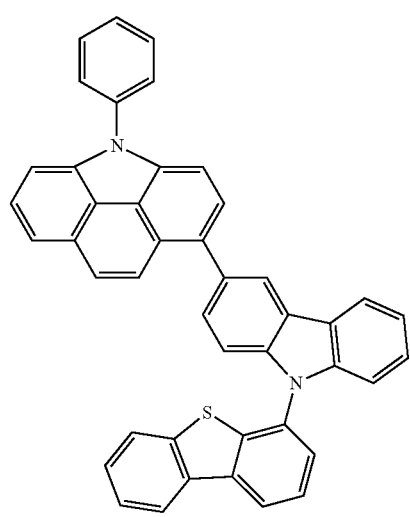
19
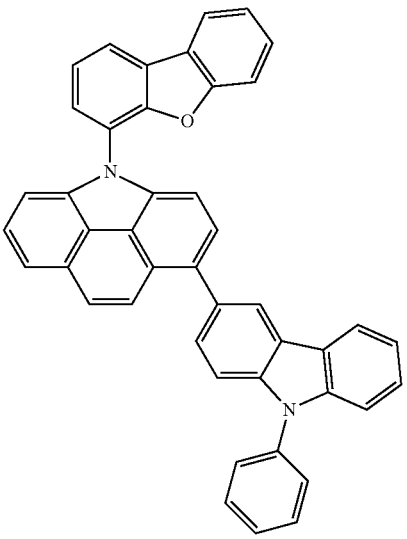
20
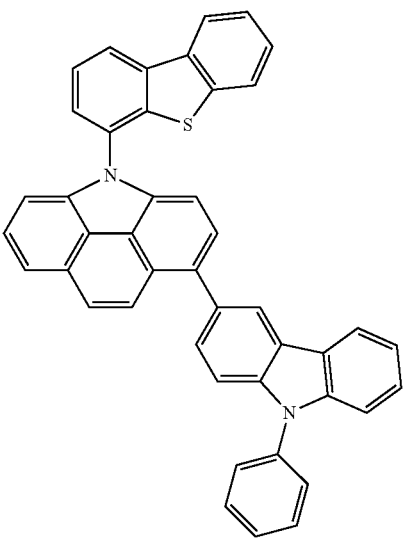
21
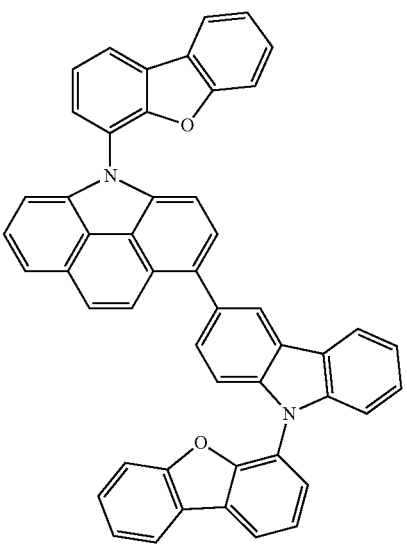

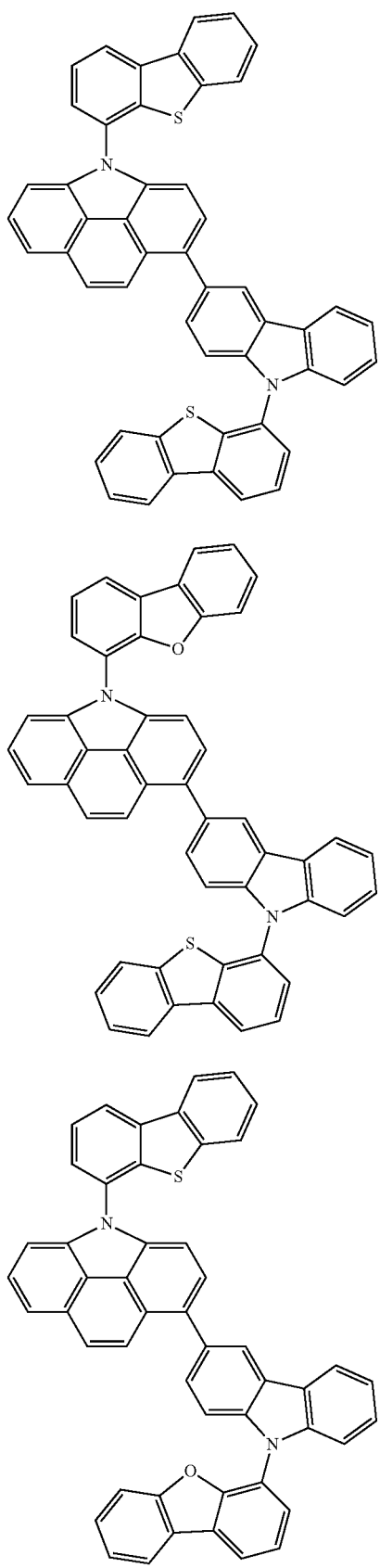
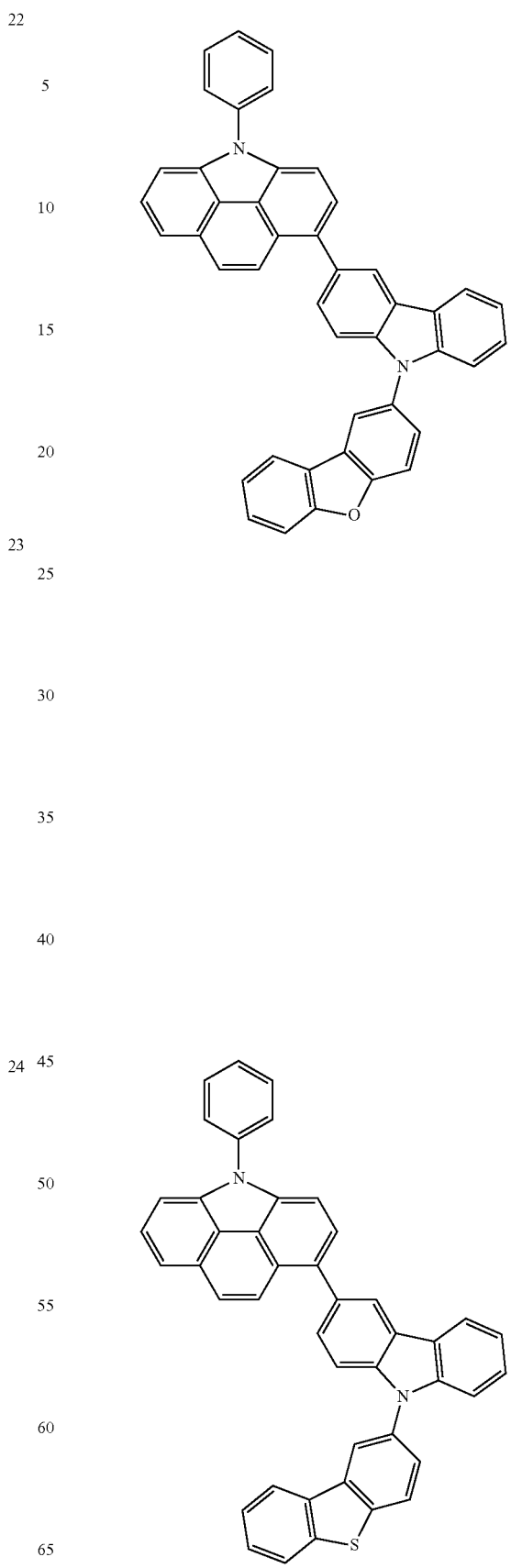

27
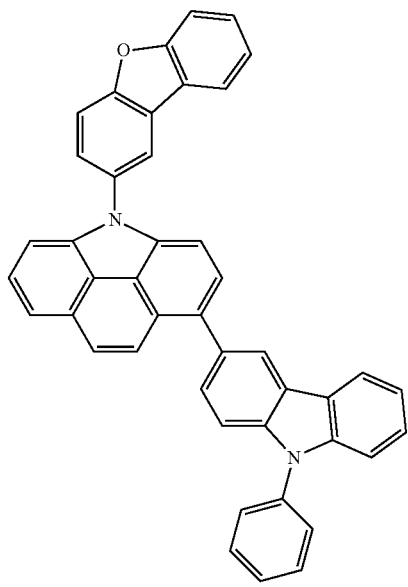
28
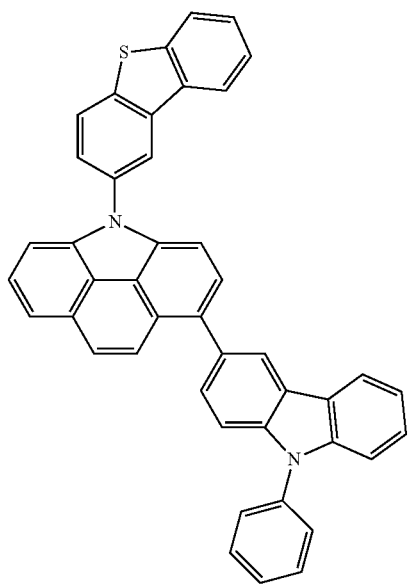
29
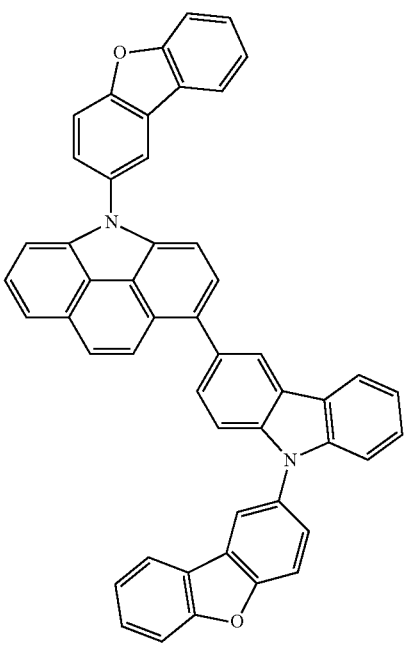
30
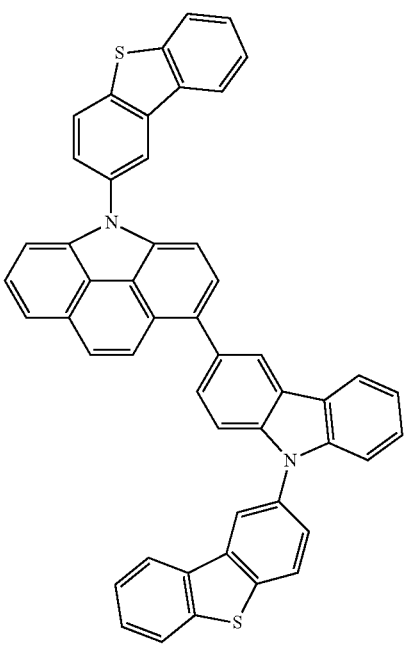

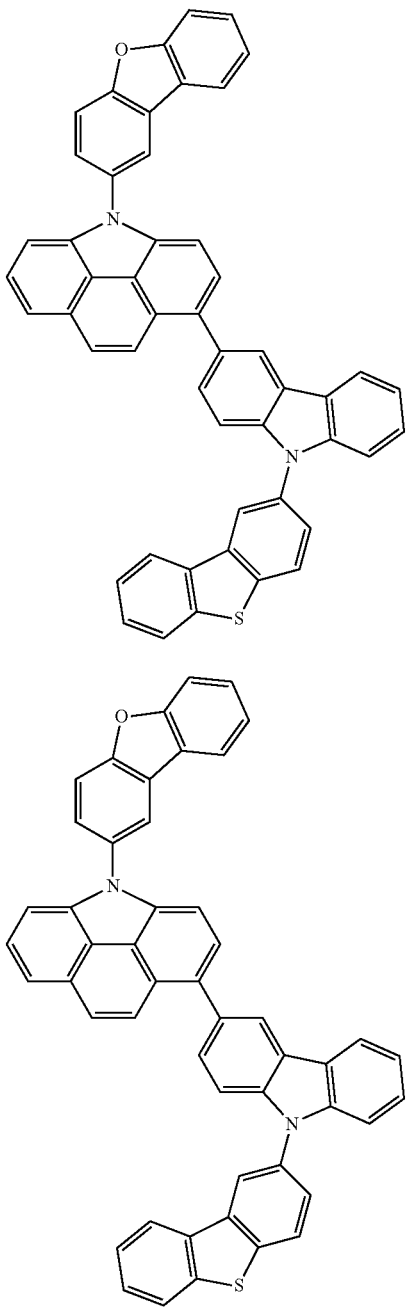

An organic light-emitting device according to an embodiment of the present invention includes a first electrode, a second electrode, and an organic layer between the first electrode and the second electrode, and the organic layer includes the heterocyclic compound represented by Formula 1.

The organic layer may include at least one layer selected from a hole injection layer, a hole transport layer, a functional layer having both a hole injection function and a hole transport function (hereinafter referred to as an "H-functional layer"), a buffer layer, an electron blocking layer, an emission layer, a hole blocking layer, an electron transport layer, an electron injection layer, and a functional layer having both an electron transport function and an electron injection function (hereinafter referred to as an "E-functional layer").

For example, the organic layer may be an emission layer or an electron transport layer.

According to an embodiment of the present invention, the organic layer may include an electron injection layer, an electron transport layer, an emission layer, a hole injection layer, a hole transport layer, or a functional layer having both hole injection capability and hole transportation capability. The emission layer may further include an anthracene-based compound, an arylamine-based compound, or a styryl-based compound.

In some embodiments, the organic layer may an electron injection layer, an electron transport layer, an emission layer, a hole injection layer, a hole transport layer, or a functional layer having hole injection capability and hole transportation capability. The emission layer may include a red layer, a green layer, a blue layer, and a white layer, and any one of these layers may include a phosphorescent compound. The hole injection layer, the hole transport layer, or the functional layer having hole injection capability and hole transportation capability may include a charge-generation material. The charge-generation material may be a p-dopant, and the p-dopant may be a quinone derivative, a metal oxide, or a cyano group-containing compound.

In some embodiments, the organic layer may include an electron transport layer that includes an electron-transporting organic compound and a metal complex. The metal complex may be a Li complex.

As used herein, the term "organic layer" refers to a single layer and/or a plurality of layers positioned between the first electrode and the second electrode of the organic light-emitting device.

The organic layer includes an emission layer, and the emission layer may include the compound represented by Formula 1. The organic layer may include at least one layer selected from a hole injection layer, a hole transport layer, or a H-functional layer. The at least one layer selected from the hole injection layer, the hole transport layer, or the H-functional layer may include the compound represented by Formula 1.

FIG. 1 is a schematic cross-sectional view of an organic light-emitting device according to an embodiment of the present invention. Hereinafter, the structure of an organic light-emitting device according to an embodiment of the present invention, and a method of manufacturing the organic light-emitting device according to another embodiment of the present invention will be described with reference to FIG. 1.

The substrate (not shown) may be any one of various substrates that are commonly used in organic light-emitting devices, and may be a glass substrate or a transparent plastic substrate with mechanical strength, thermal stability, transparency, surface smoothness, ease of handling, and water resistance.

A first electrode may be formed by depositing or sputtering a first electrode material on the substrate. When the first electrode is an anode, the first electrode material may be selected from materials with a high work function to facilitate easy hole injection. The first electrode may be a reflective electrode or a transmissive electrode. The material for the first electrode may be a transparent material with high conductivity, and non-limiting examples of the material include indium tin oxide (ITO), indium zinc oxide (IZO), tin oxide ($SnO_2$), and zinc oxide (ZnO). According to an embodiment of the present invention, the first electrode may be formed as a reflective electrode using magnesium (Mg), aluminum (Al), aluminum-lithium (Al—Li), calcium (Ca), magnesium-indium (Mg—In), or magnesium-silver (Mg—Ag).

The first electrode may have a single-layer structure or a multi-layer structure including at least two layers. For example, the first electrode may have a three-layered structure of ITO/Ag/ITO, but is not limited thereto.

An organic layer may be formed on the first electrode. The organic layer may include a hole injection layer, a hole transport layer, a buffer layer, an emission layer, an electron transport layer, and an electron injection layer.

The hole injection layer (HIL) may be formed on the first electrode by any one of various methods, for example, vacuum deposition, spin coating, casting, or Langmuir-Blodgett (LB) deposition. When the HIL is formed by vacuum deposition, the deposition conditions may vary according to the material that is used to form the HIL, and the desired structural and thermal characteristics of the HIL. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the HIL is formed using spin coating, the coating conditions may vary according to the material used to form the HIL, and the desired structural and thermal properties of the HIL. For example, the coating speed may be about 2,000 rpm to about 5,000 rpm, and the temperature at which heat treatment is performed to remove solvent after coating may be about 80° C. to about 200° C. However, the coating conditions are not limited thereto.

Any suitable hole injection material may be used, non-limiting examples of which include N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenylbenzidine (NPB), TDATA, 2-TNATA, a polyaniline/dodecylbenzenesulfonic acid (pani/DBSA), poly(3,4-ethylenedioxythiophene)/poly(4-styrenesulfonate) (PEDOT/PSS), polyaniline/camphor sulfonicacid (pani/CSA), or (polyaniline)/poly(4-styrenesulfonate) (PANI/PSS).

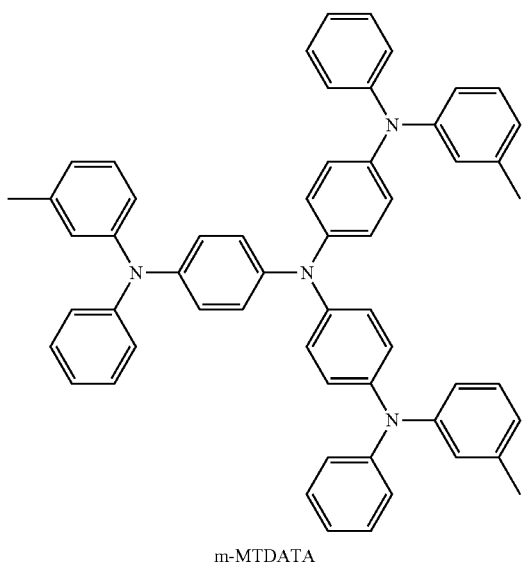

m-MTDATA

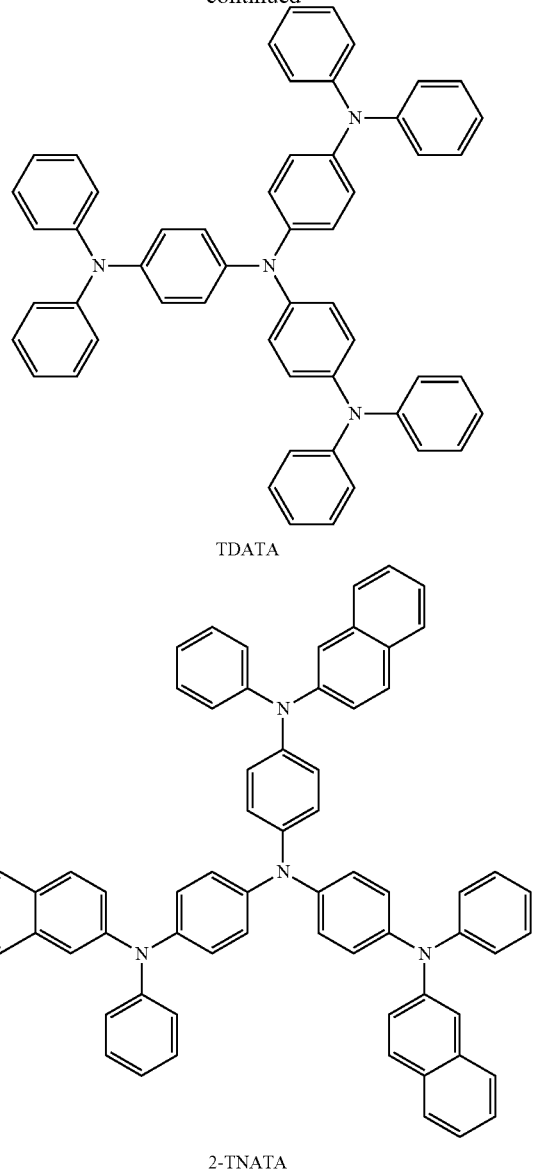

TDATA

2-TNATA

The thickness of the HIL may be about 100 Å to about 10,000 Å, for example, about 100 Å to about 1,000 Å. When the thickness of the HIL is within these ranges, the HIL may have satisfactory hole injection characteristics without a substantial increase in a driving voltage.

Then, a hole transport layer (HTL) may be formed on the HIL by vacuum deposition, spin coating, casting, Langmuir-Blodgett (LB) deposition, or the like. When the HTL is formed by vacuum deposition or spin coating, the deposition or coating conditions may be similar to those used to form the HIL, although the deposition or coating conditions may vary according to the material that is used to form the HTL.

Any suitable hole transportation material may be used, non-limiting examples of which include a carbazole derivative, such as N-phenylcarbazole, or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), N,N'-di(1-naphthyl)-N,N'-diphenylbenzidine (NPB), or the like.

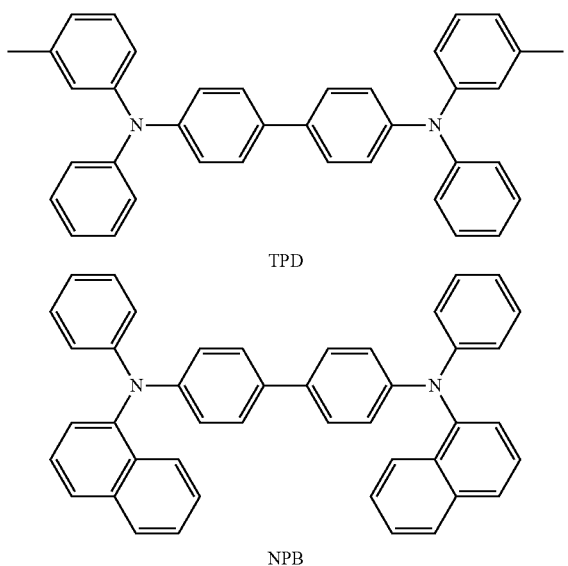

TPD

NPB

The thickness of the HTL may be about 50 Å to about 2,000 Å, for example, about 100 Å to about 1,500 Å. When the thickness of the HTL is within these ranges, the HTL may have satisfactory hole transportation properties without a substantial increase in a driving voltage.

The H-functional layer (i.e., a functional layer having hole injection ability and hole transport ability) may include one or more materials selected from the materials for the HIL and the materials for the HTL. The thickness of the H-functional layer may be about 500 Å to about 10,000 Å, for example, about 100 Å to about 1,000 Å. When the thickness of the H-functional layer is within these ranges, satisfactory hole injection and transportation properties may be obtained without a substantial increase in driving voltage.

Also, at least one layer of the hole injection layer, the hole transport layer, or the H-functional layer may include at least one compound selected from compounds represented by Formula 300 below and compounds represented by Formula 350 below.

Formula 300

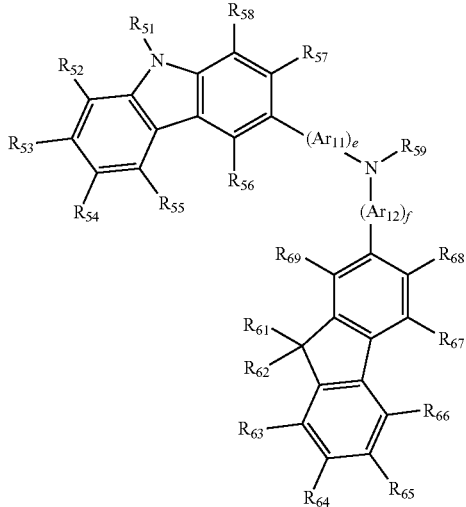

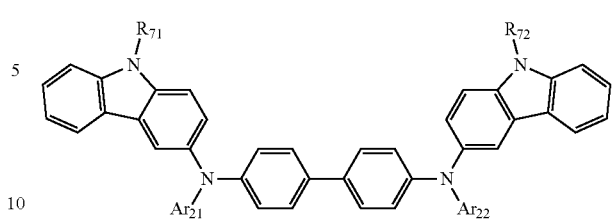

Formula 350

In Formulae 300 and 350, $Ar_{11}$, $Ar_{12}$, $Ar_{21}$, and $Ar_{22}$ are each independently a substituted or unsubstituted C5-C60 arylene group.

In Formulae 300, e and f may each independently be an integer of 0 to 5, or 0, 1 or 2. For example, e may be 1 and f may be 0, but e and f are not limited thereto.

In Formulae 300 and 350, $R_{51}$ to $R_{58}$, $R_{61}$ to $R_{69}$, and $R_{71}$ and $R_{72}$ may each independently be a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C3-C60 cycloalkyl group, a substituted or unsubstituted C5-C60 aryl group, a substituted or unsubstituted C5-C60 aryloxy group, or a substituted or unsubstituted C5-C60 arylthio group.

For example, $R_{51}$ to $R_{58}$, $R_{61}$ to $R_{69}$, $R_{71}$ and $R_{72}$ may each independently be:

a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a C1-C10 alkyl group (for example, a methyl group, an ethyl group, a propyl group, a butyl group, a pentyl group, a hexyl group, or the like), or a C1-C10 alkoxy group (for example, a methoxy group, an ethoxy group, a propoxy group, a butoxy group, a pentoxy group, or the like); or a C1-C10 alkyl group or a C1-C10 alkoxy group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, or a phosphoric acid group or a salt thereof; or a phenyl group, a naphthyl group, an anthryl group, a fluorenyl group, or a pyrenyl group; or a phenyl group, a naphthyl group, an anthryl group, a fluorenyl group, or a pyrenyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a C1-C10 alkyl group, or a C1-C10 alkoxy group. However, $R_{51}$ to $R_{58}$, $R_{61}$ to $R_{69}$, $R_{71}$ and $R_{72}$ are not limited thereto.

$R_{59}$ in Formula 300 may be:

a phenyl group, a naphthyl group, an anthryl group, a biphenyl group, or a pyridyl group; or a phenyl group, a naphthyl group, an anthryl group, a biphenyl group, or a pyridyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted C1-C20 alkyl group, or a substituted or unsubstituted C1-C20 alkoxy group.

According to an embodiment of the present invention, the compound represented by Formula 300 may be represented by Formula 300A, but the chemical structure of the compound is not limited thereto.

Formula 300A

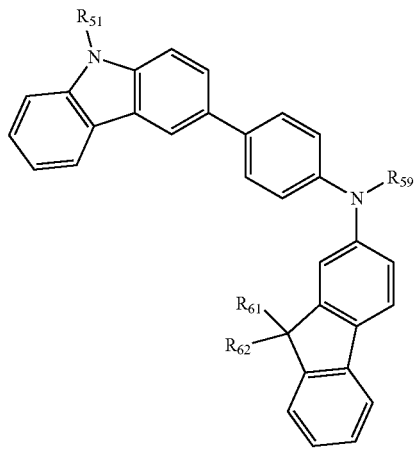

$R_{51}$, $R_{60}$, $R_{61}$, and $R_{59}$ in Formula 300A are as described above with respect to Formula 300.

For example, at least one of the HIL, the HTL, or the H-functional layer may include at least one of Compounds 301 to 320 below, but may also include other materials.

301

302

303

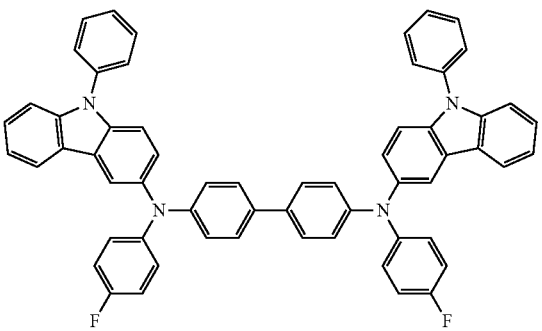

304

305

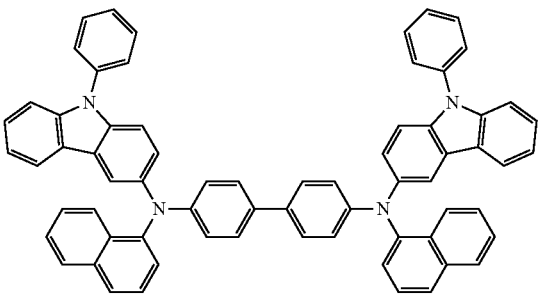

306

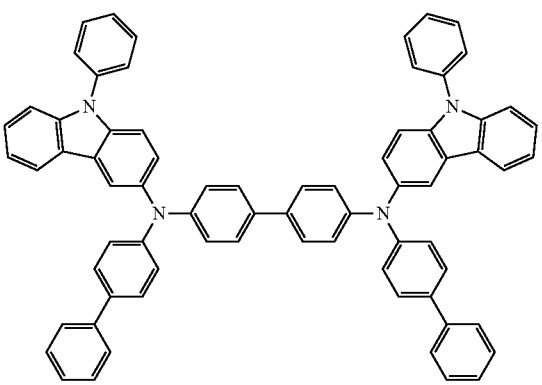

307
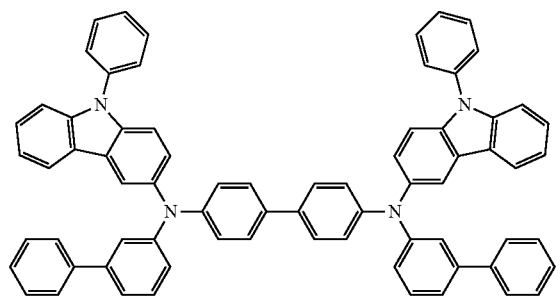
308
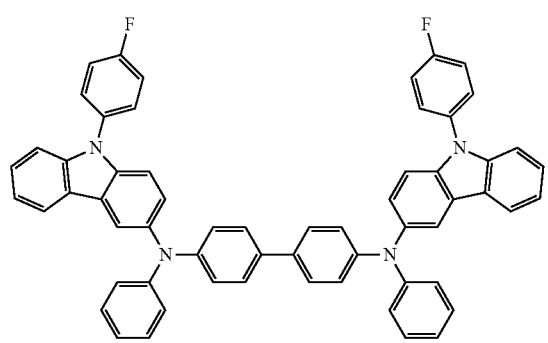
309
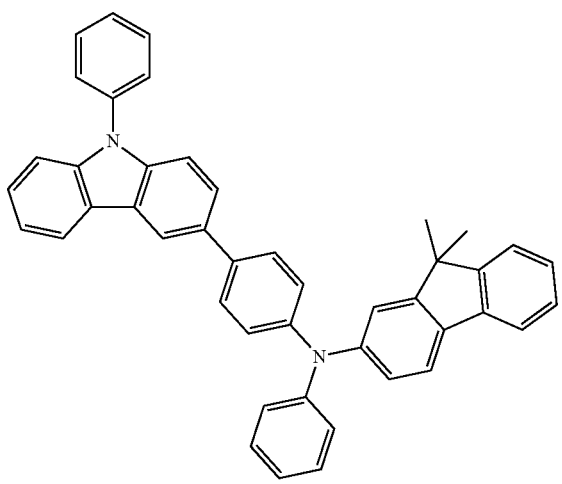
310
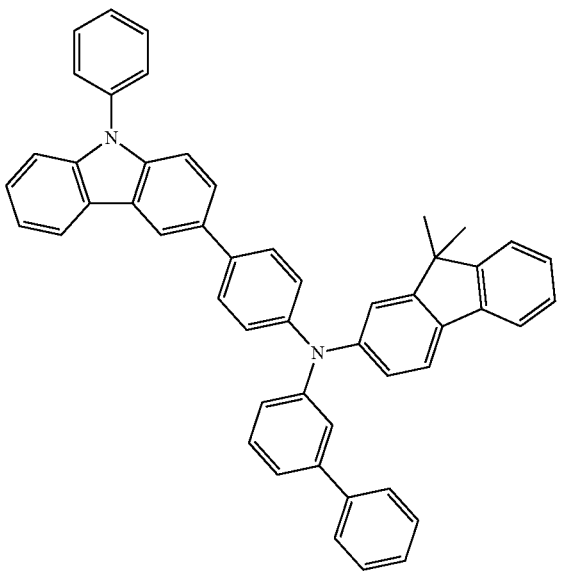
311
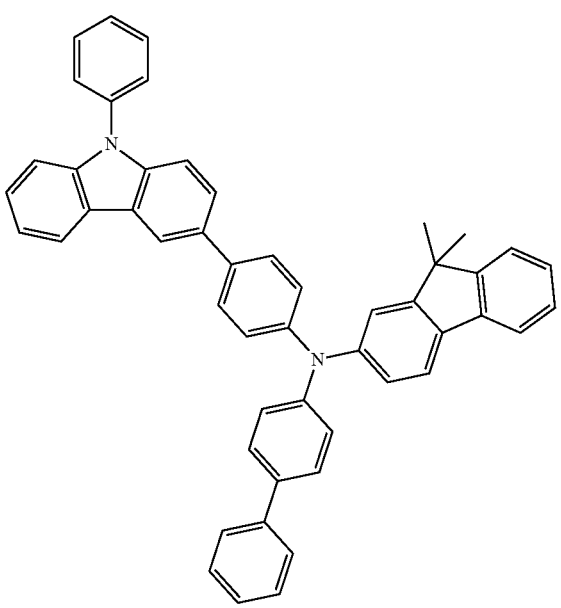

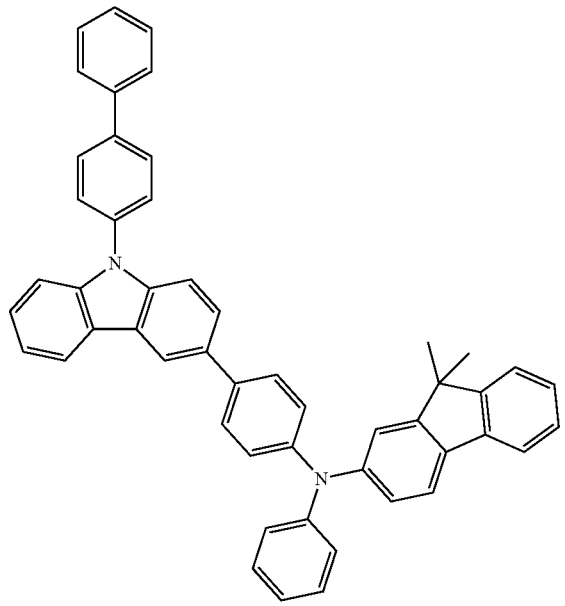
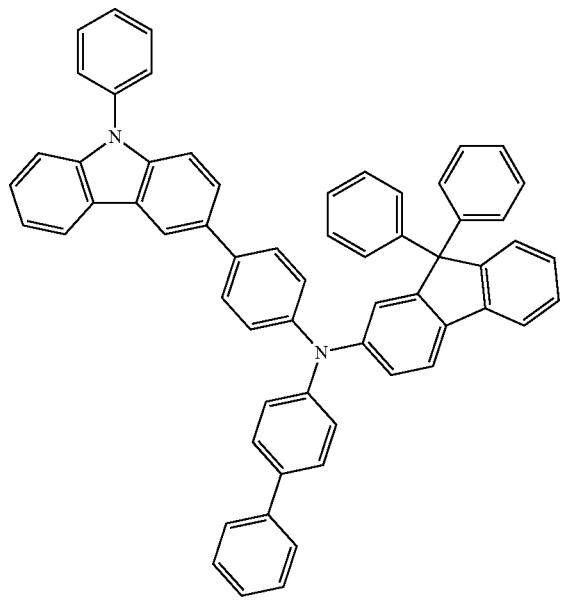

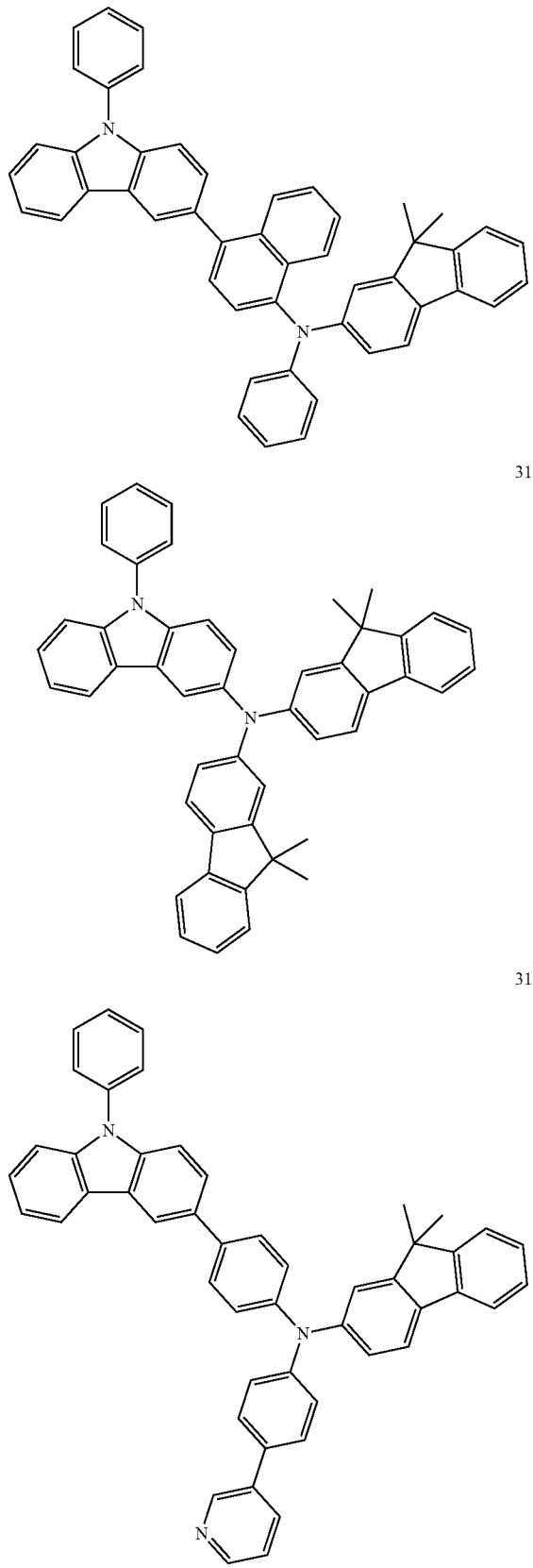

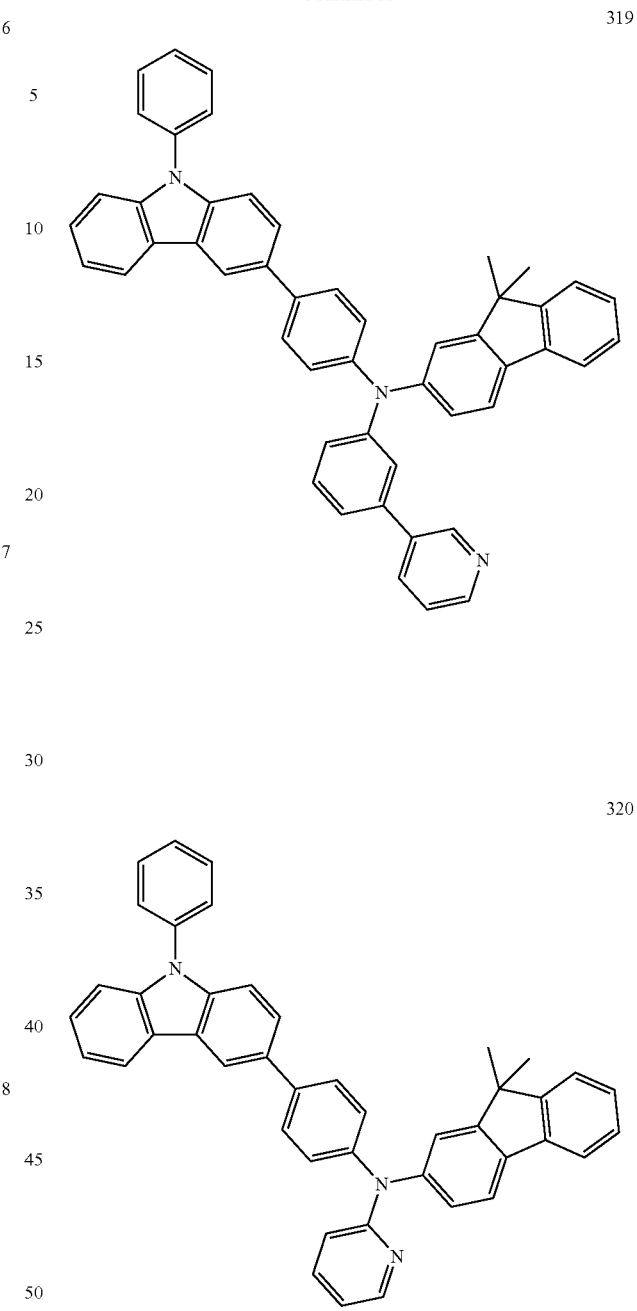

To increase the conductivity of the layer, at least one of the HIL, the HTL, and the H-functional layer may further include a charge-generation material in addition to the hole injecting materials, hole transport materials, and/or materials having both hole injection and hole transport capabilities. The charge-generation material may be, for example, a p-dopant. The p-dopant may be one of a quinone derivative, a metal oxide, or a cyano group-containing compound, but is not limited thereto. Non-limiting examples of the p-dopant include a quinone derivative, such as tetracyanoquinonedimethane (TCNQ) and 2,3,5,6-tetrafluoro-tetracyano-1,4-benzoquinonedimethane (F4-TCNQ), or the like; a metal oxide, such as a tungsten oxide and a molybdenum oxide; and a cyano group-containing compound, such as Compound 200 below.

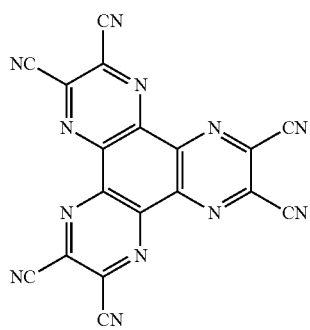

Compound 200

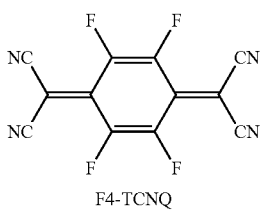

F4-TCNQ

When the hole injection layer, the hole transport layer, or the H-functional layer further includes a charge-generation material, the charge-generation material may be homogeneously dispersed or non-homogeneously distributed in the hole injection layer, the hole transport layer, or the H-functional layer.

A buffer layer may be disposed between the emission layer and at least one of the HIL, the HTL, and the H-functional layer. The buffer layer may compensate for an optical resonance distance of light according to a wavelength of the light emitted from the emission layer, and thus may increase efficiency. The butter layer may include any hole injecting material or hole transporting material. In some other embodiments, the buffer layer may include the same material as one of the materials included in the HIL, HTL, or H-functional layer underneath the buffer layer.

Subsequently, an emission layer (EML) may be formed on the hole transport layer, the H-functional layer, or the buffer layer by vacuum deposition, spin coating, casting, LB deposition, etc. If the EML is formed by vacuum deposition or spin coating, the deposition or coating conditions may be similar to those used to form the HIL, although the deposition or coating conditions may vary according to the material that is used to form the EML.

The EML may be formed using the compound according to an embodiment of the present invention, or various other hosts and dopants. The dopant for use in the EML may be a fluorescent dopant or a phosphorescent dopant.

Non-limiting examples of suitable hosts include Alq$_3$, 4,4'-N,N'-dicarbazole-biphenyl (CBP), poly(n-vinylcarbazole)(PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), dmCBP (shown below), Compounds 501 to 509 (shown below), and the like.

TPBI

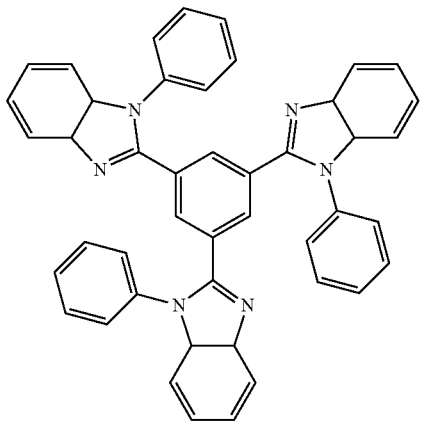

TBADN

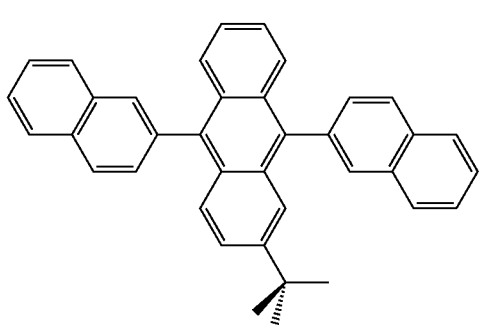

E3

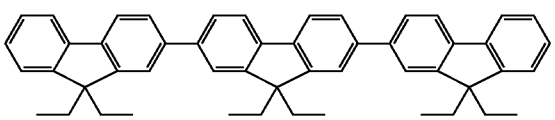

PVK

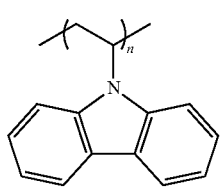

ADN

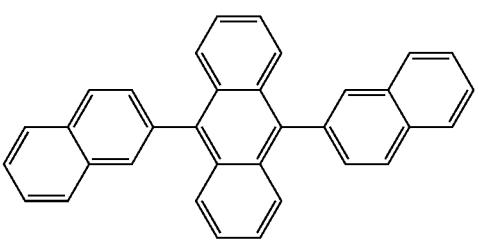

CBP

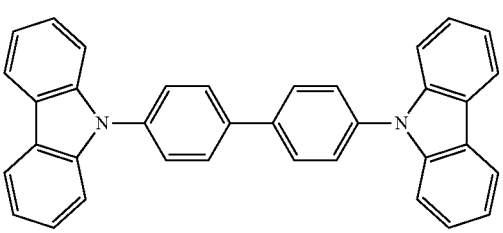

dmCBP
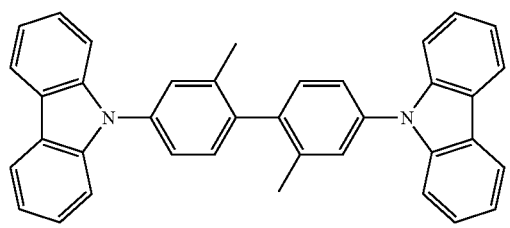
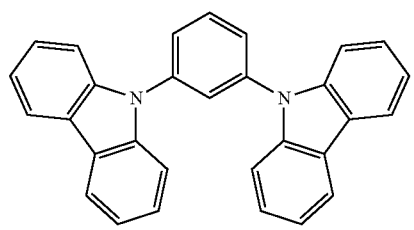
501
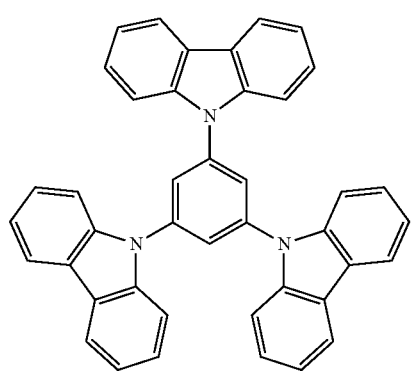
502
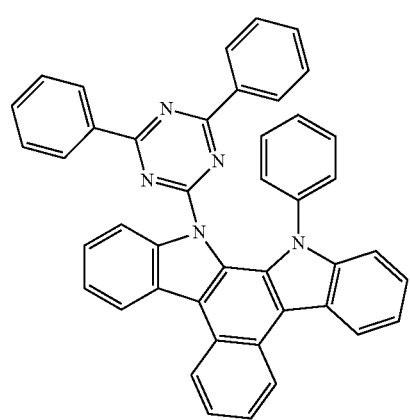
503
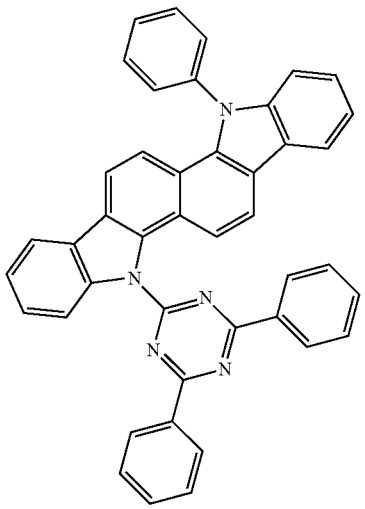
504
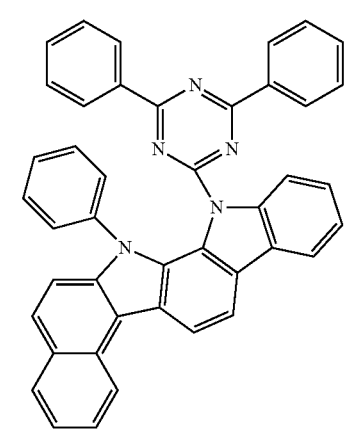
505
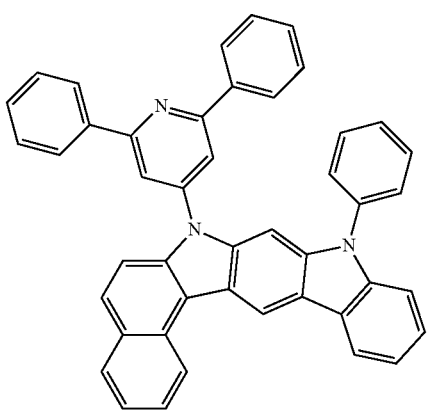
506

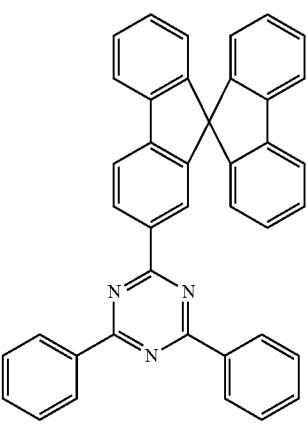
507

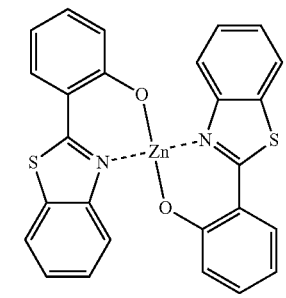
508

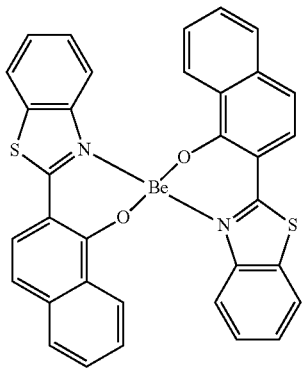
509

Also, the host may be an anthracene-based compound represented by Formula 400 below.

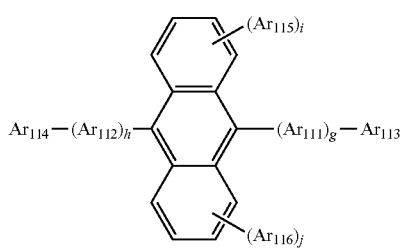
Formula 400

In Formula 400, $Ar_{111}$ and $Ar_{112}$ may each independently be a substituted or unsubstituted C5-C60 arylene group.

$Ar_{113}$ to $Ar_{116}$ may each independently be a substituted or unsubstituted C1-C10 alkyl group, or a substituted or unsubstituted C5-C60 aryl group.

In Formula 400, g, h, l, and j are each independently an integer of 0 to 4.

In Formula 400, for example, $Ar_{111}$ and $Ar_{112}$ may each independently be:

a phenylenyl group, a naphthalenyl group, a phenanthrenyl group, a fluorenyl group, or a pyrenylenyl group; or a phenylenyl group, a naphthalenyl group, a phenanthrenyl group, a fluorenyl group, or a pyrenylenyl group substituted with at least one of a phenyl group, a naphthyl group, or an anthryl group. However, $Ar_{111}$ and $Ar_{112}$ are not limited thereto.

In Formula 400, g, h, i, and j may each independently be 0, 1, or 2.

In Formula 400, $Ar_{113}$ to $Ar_{116}$ may each independently be:

a C1-C10 alkyl group substituted with at least one of a phenyl group, a naphthyl group, or an anthryl group;

a phenyl group; a naphthyl group; an anthryl group; a pyrenyl group; a phenanthrenyl group; a fluorenyl group; or a phenyl group, a naphthyl group, an anthryl group, a pyrenyl group, a phenanthrenyl group, or a fluorenyl group substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a C1-C60 alkyl group, a C2-C60 alkenyl group, a C2-C60 alkynyl group, a C1-C60 alkoxy group, a phenyl group, a naphthyl group, an anthryl group, a pyrenyl group, a phenanthrenyl group, a fluorenyl group, or

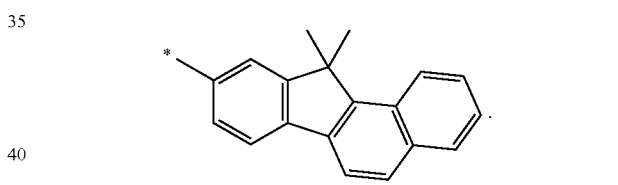

However, $Ar_{113}$ to $Ar_{116}$ are not limited thereto.

For example, the anthracene-based compound represented by Formula 400 may be one of the following compounds, but is not limited thereto.

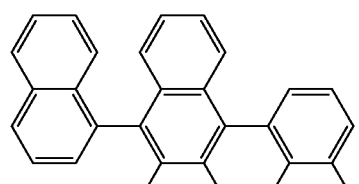

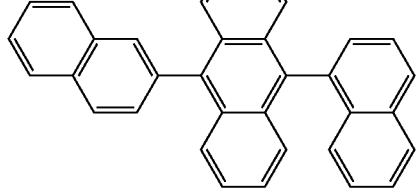

-continued
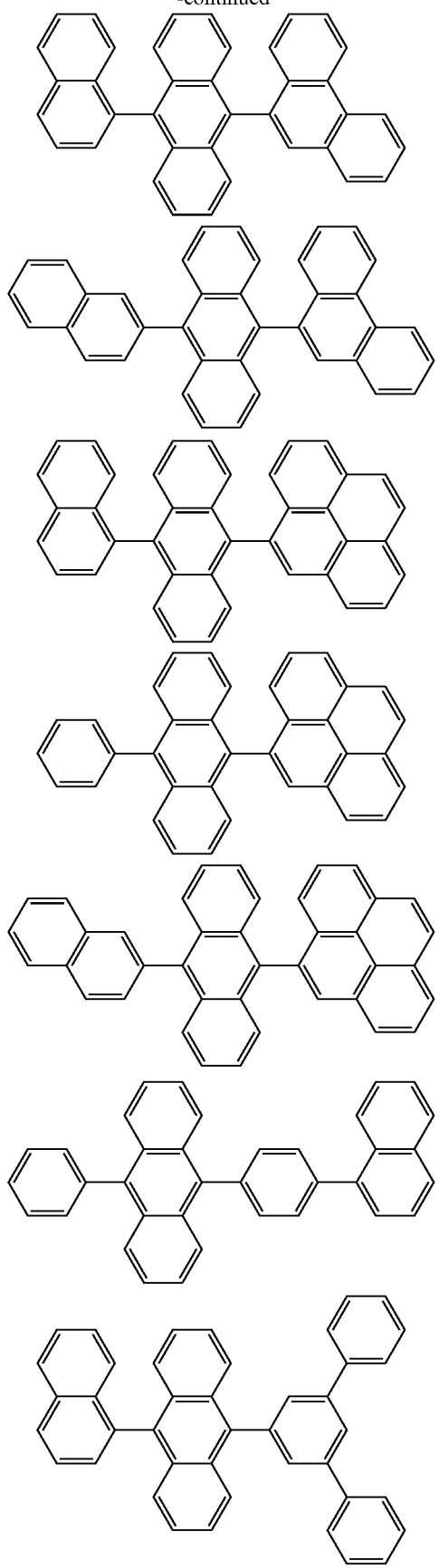
-continued
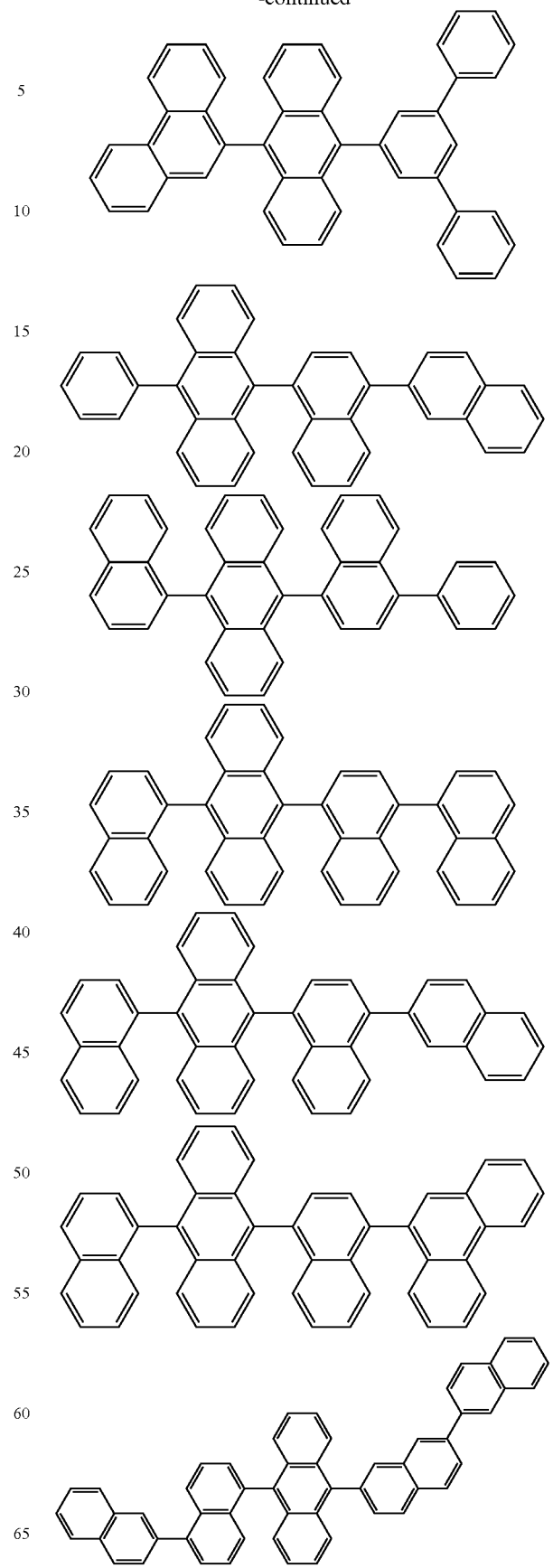

-continued
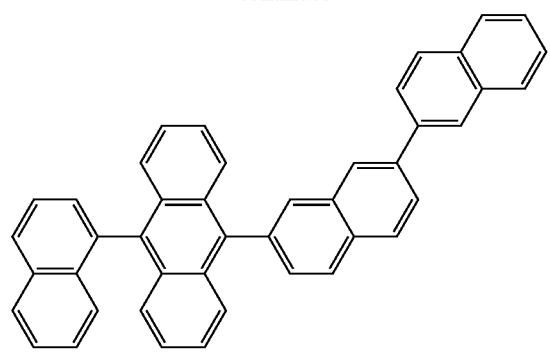
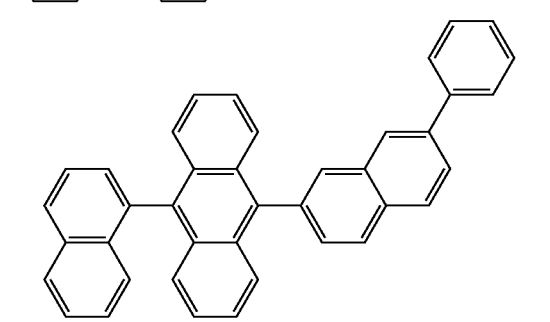
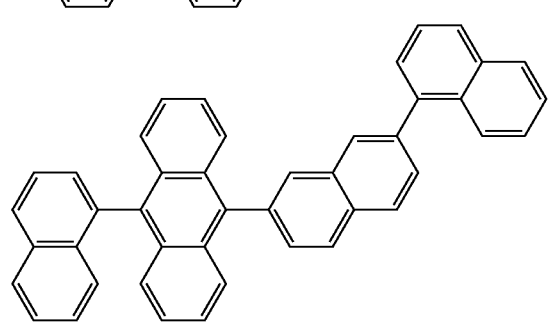
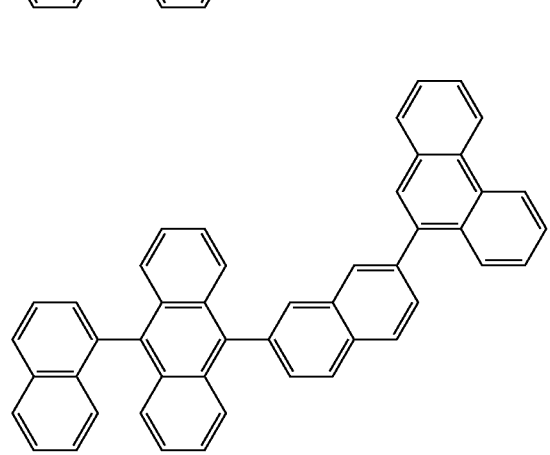
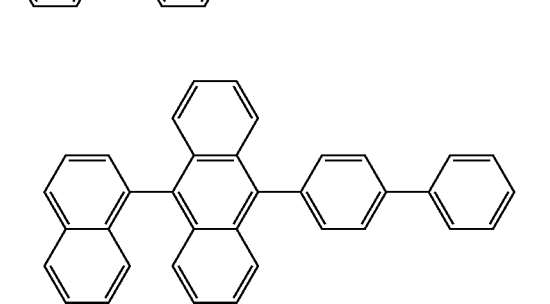
-continued
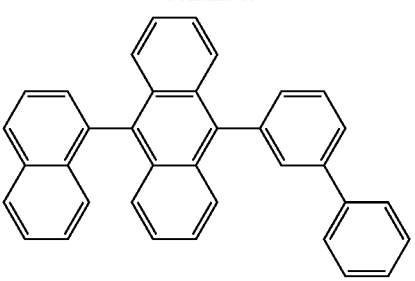
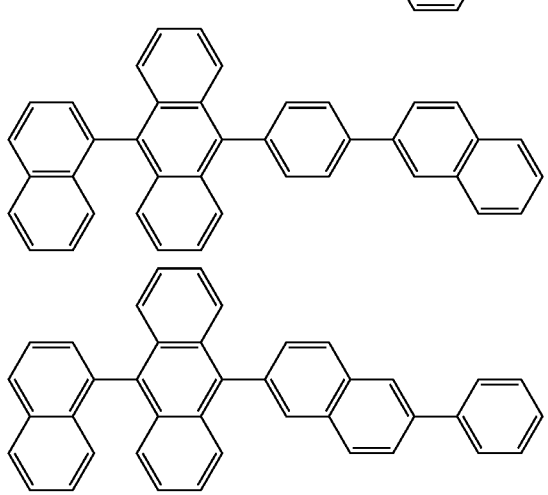
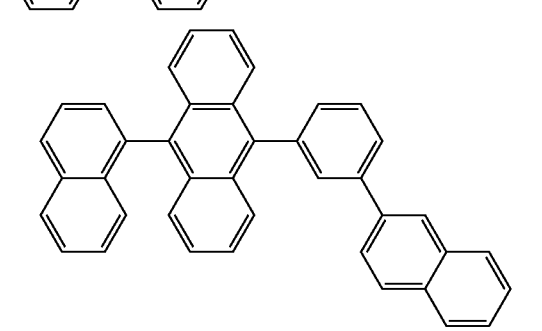
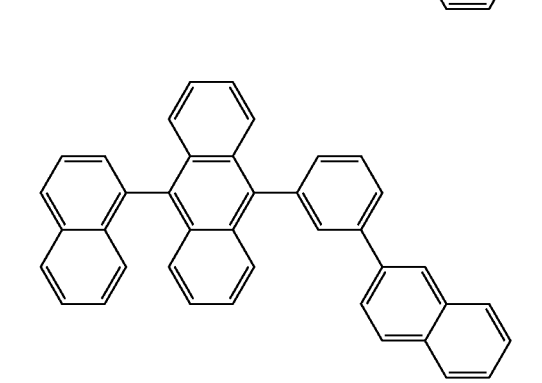
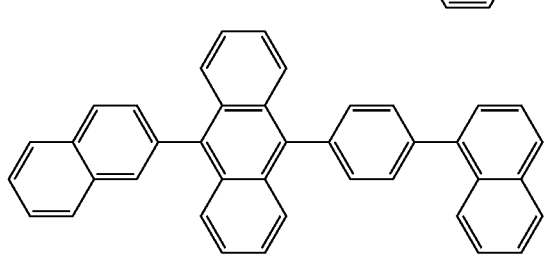

-continued
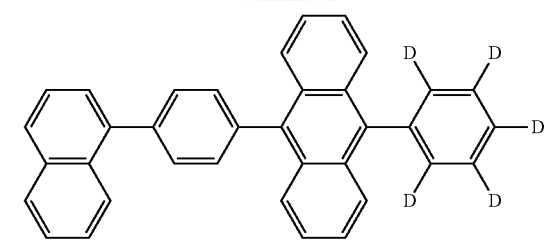
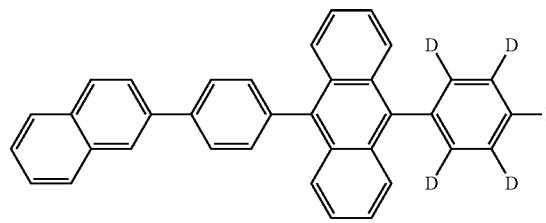
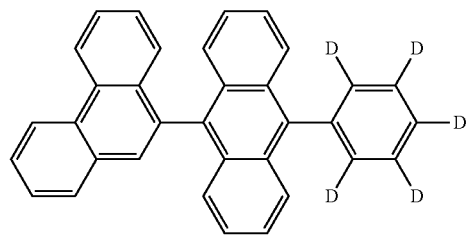
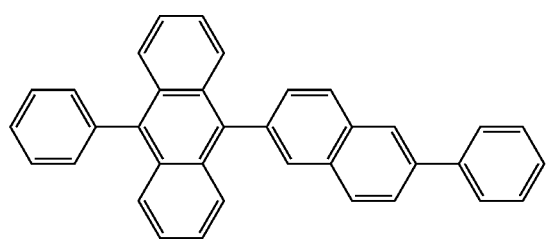
-continued
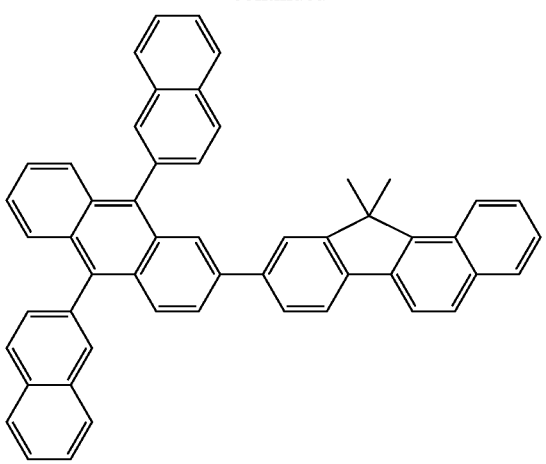
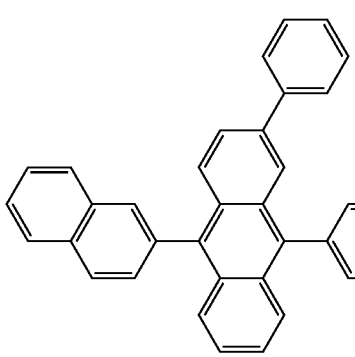
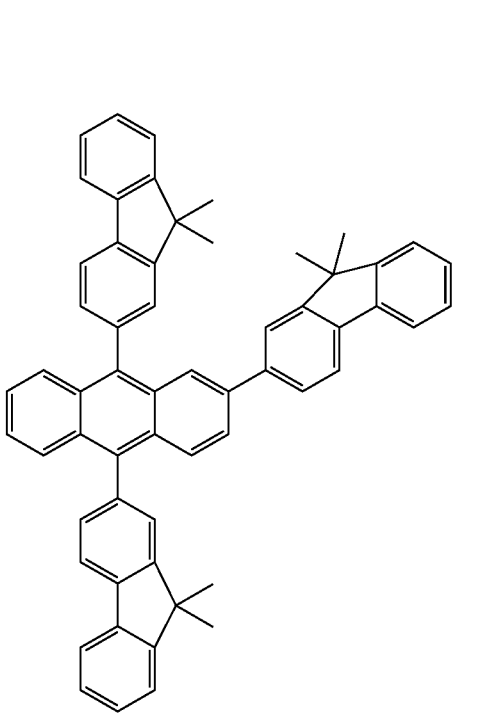

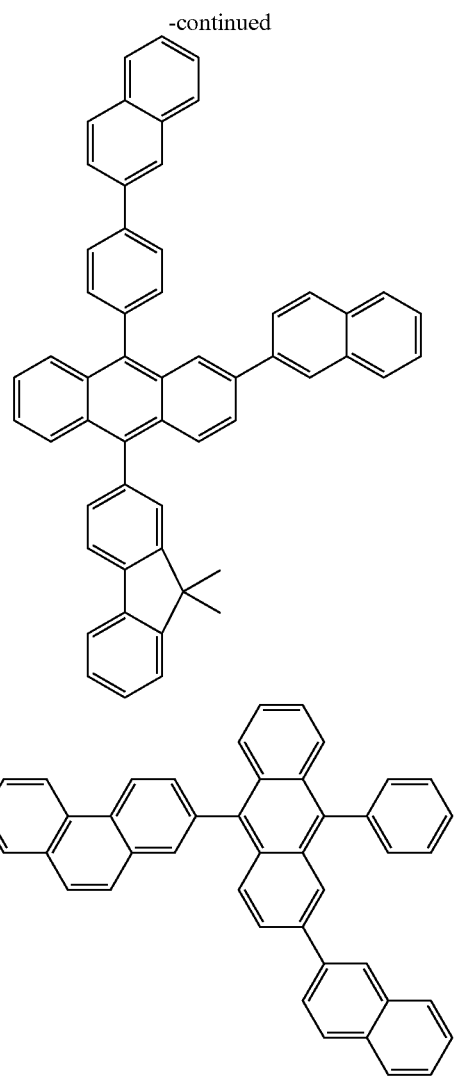

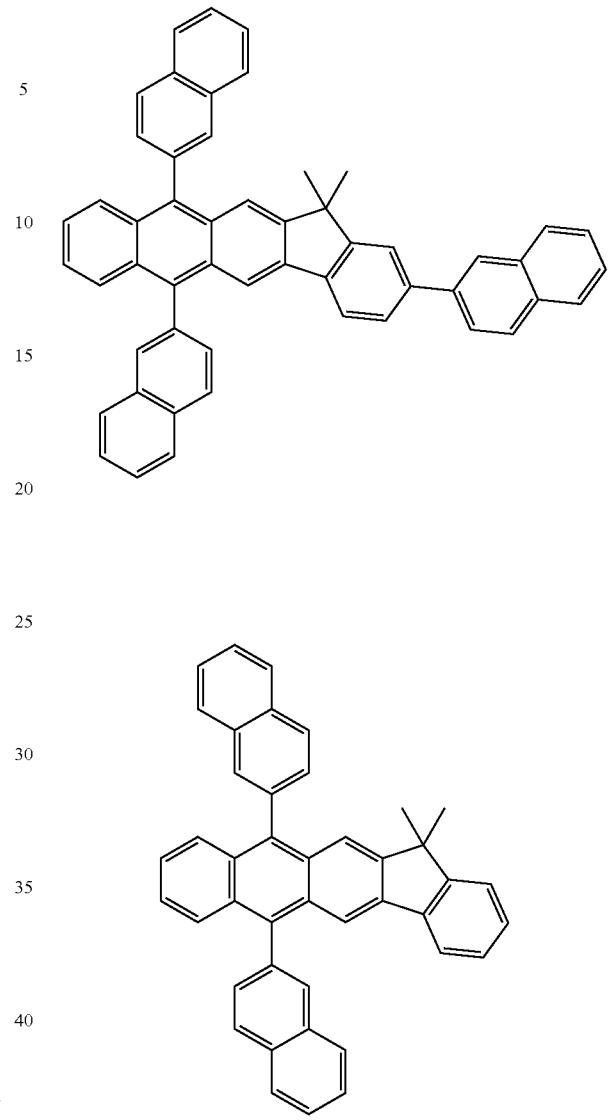

Also, the host may be an anthracene-based compound represented by Formula 401 below.

Formula 401

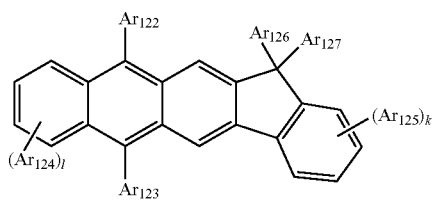

In Formula 401, $Ar_{122}$ to $Ar_{125}$ are the same as $Ar_{113}$ in Formula 400, and the description of $Ar_{113}$ in Formula 400 is fully incorporated here.

In Formula 401, $Ar_{126}$ and $Ar_{127}$ may each independently be a $C_1$-$C_{10}$ alkyl group (for example, a methyl group, an ethyl group, or a propyl group).

In Formula 401, k and l may each independently be an integer of 0 to 4. For example, k and l may be 0, 1, or 2.

For example, the anthracene-based compound represented by Formula 401 may be one of the following compounds, but is not limited thereto.

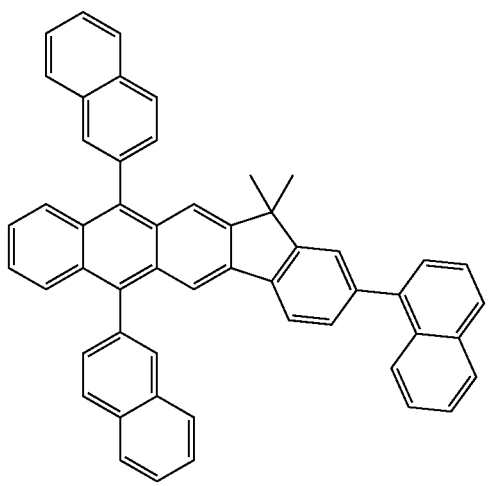

-continued

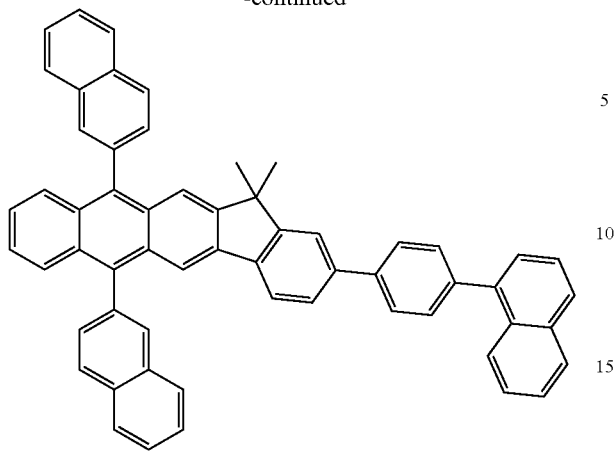

When the organic light-emitting device is a full color organic light-emitting device, the EML may be patterned into a red EML, a green EML, and a blue EML. At least one of the red EML, the green EML, and the blue EML may include one of the following dopants (ppy=phenylpyridine).

Non-limiting examples of blue dopants include the following compounds.

F₂Irpic

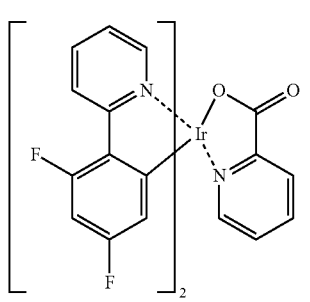

(F₂ppy)₂Ir(tmd)

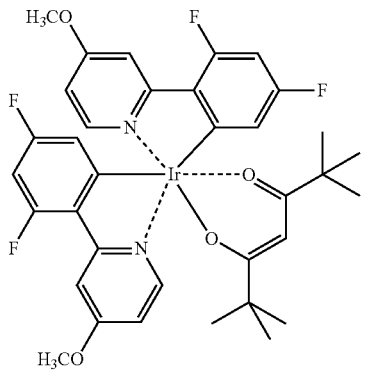

Ir(dfppz)₃

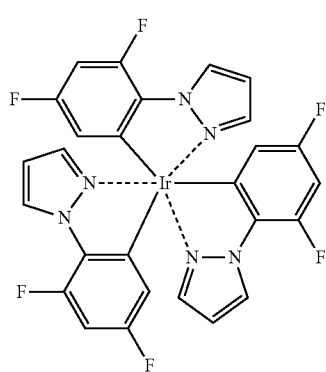

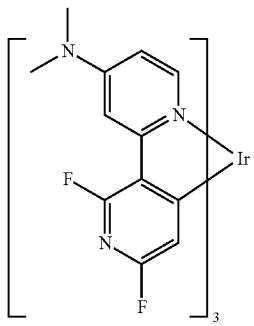

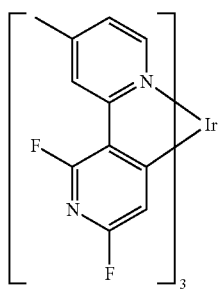

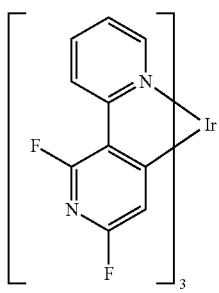

-continued
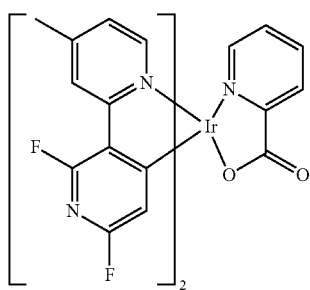
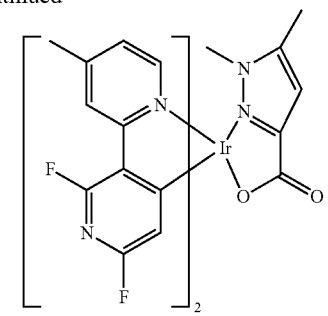
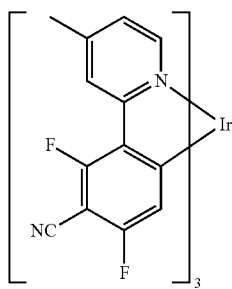
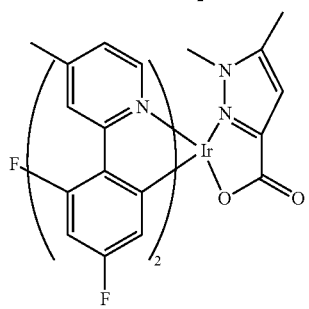
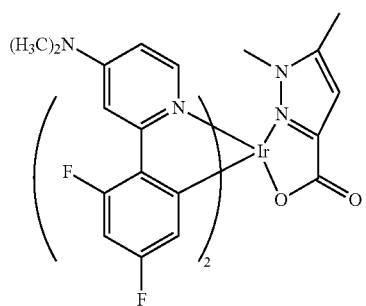
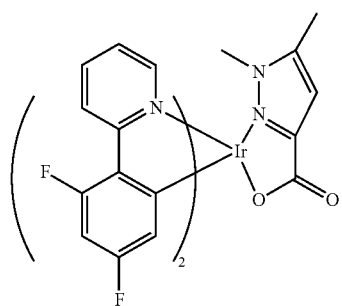
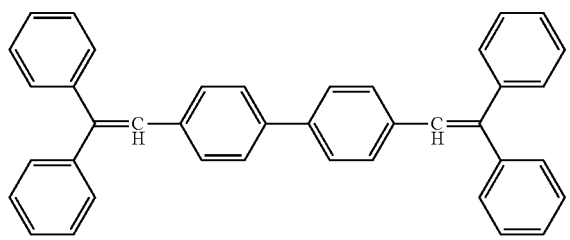
DPVBi
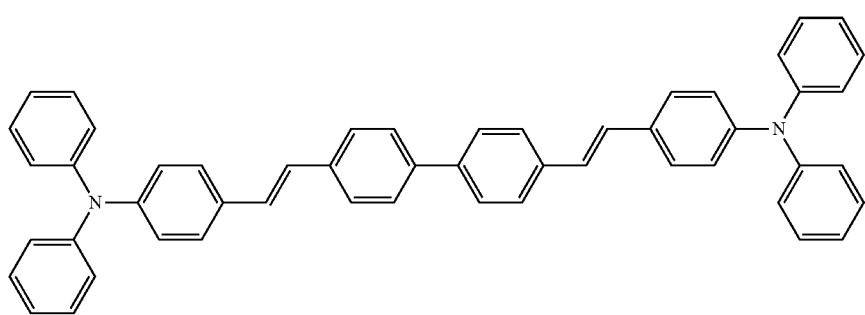
DPAVBi

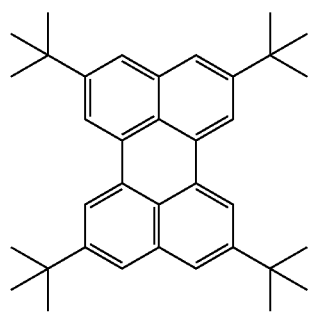
TBPe
Non-limiting examples of red dopants include the following compounds.
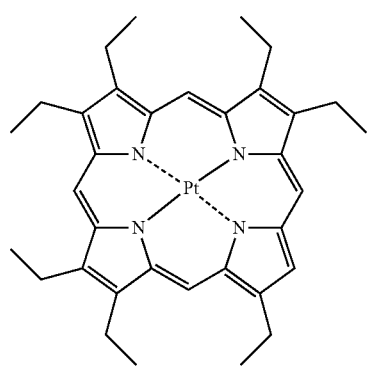
PtOEP
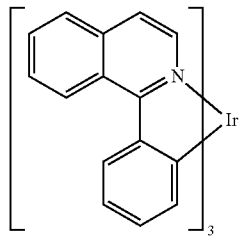
Ir(piq)₃
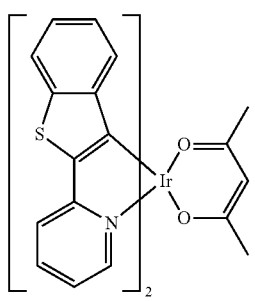
Btp₂Ir(acac)
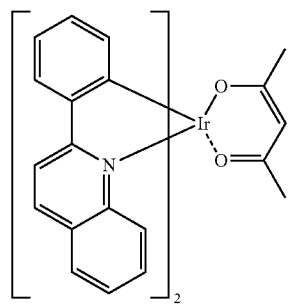
Ir(pq)₂(acac)
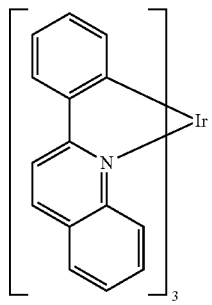
Ir(2-phq)₃
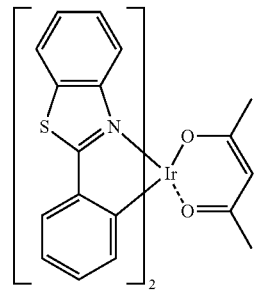
Ir(BT)₂(acac)

Ir(flq)₂(acac)
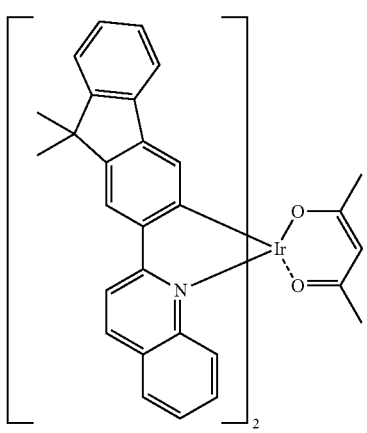
Ir(fliq)₂(acac)
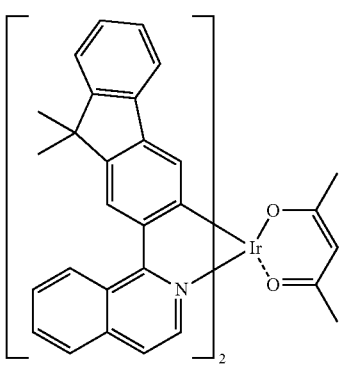
DCM
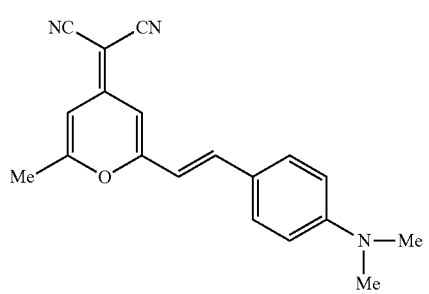
DCJTB
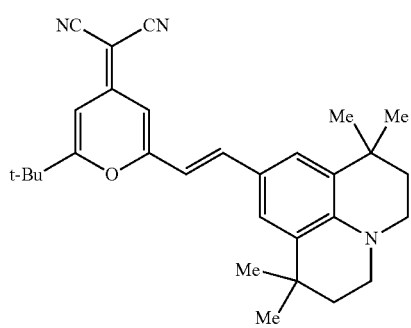
Non-limiting examples of green dopants include the following compounds.
Ir(ppy)₃
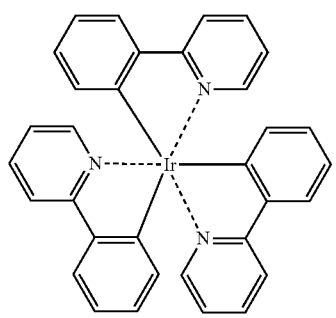
Ir(ppy)₂(acac)
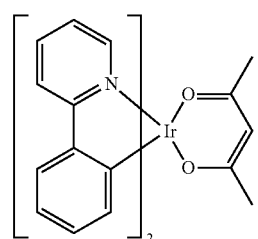
Ir(mpyp)₃
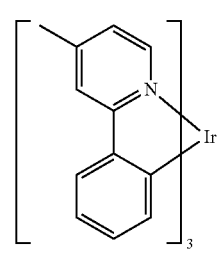
C545T
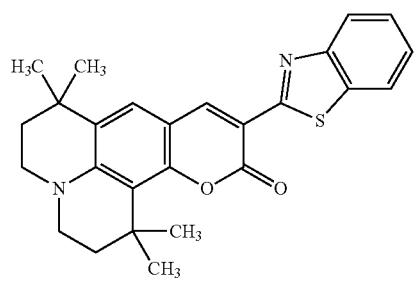
The dopant included in the EML may also be one of the following Pd-complexes or Pt-complexes, but the dopant is not limited thereto.
D1
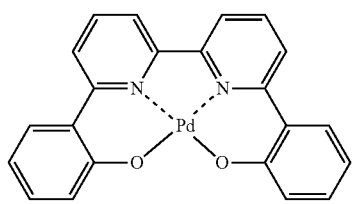

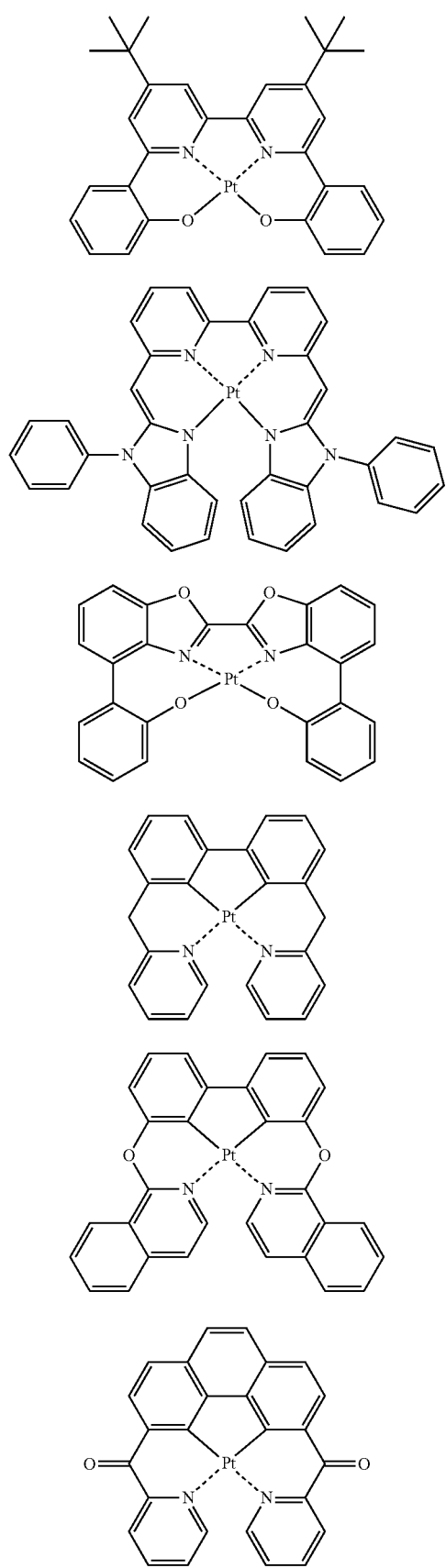
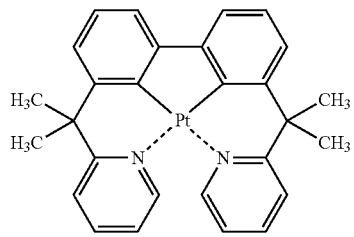
D8
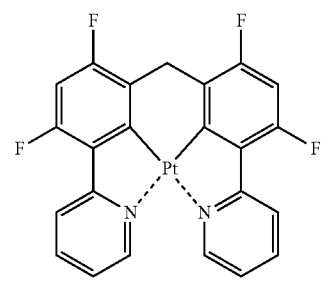
D9
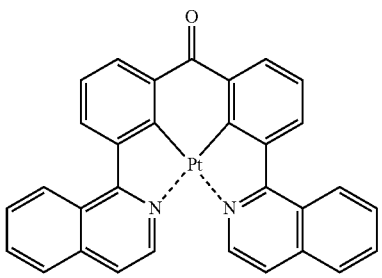
D10
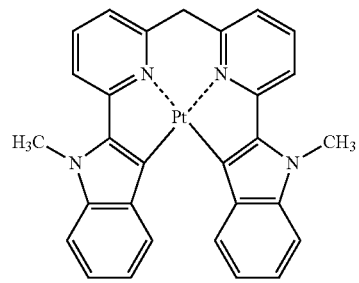
D11
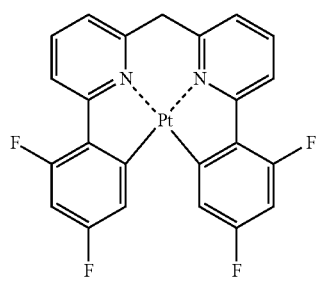
D12
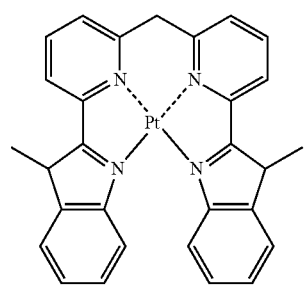
D13

-continued
D14
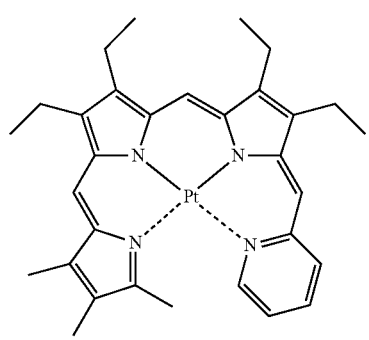
D15
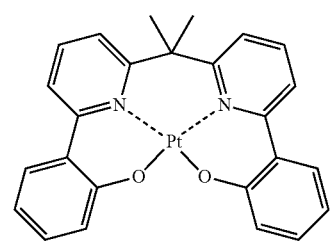
D16
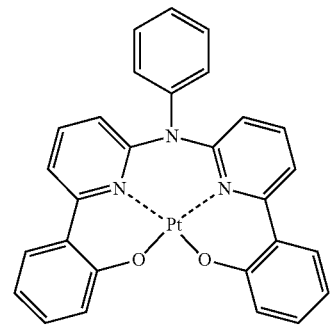
D17
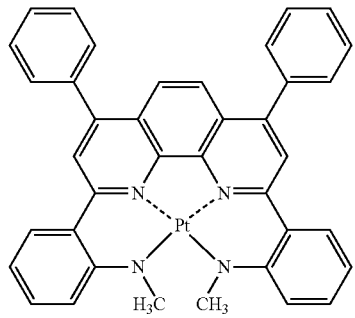
D18
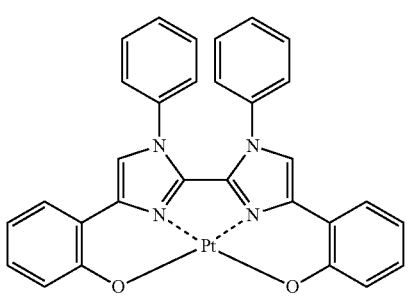
-continued
D19
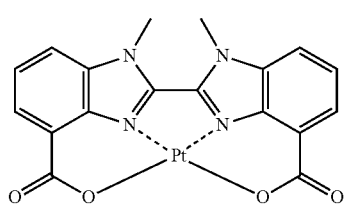
D20
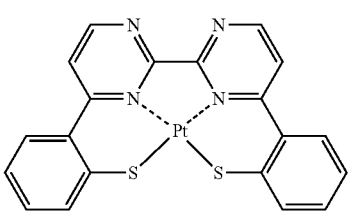
D21
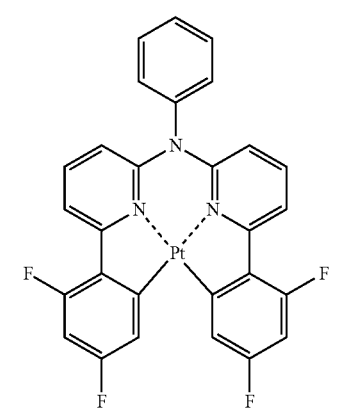
D22
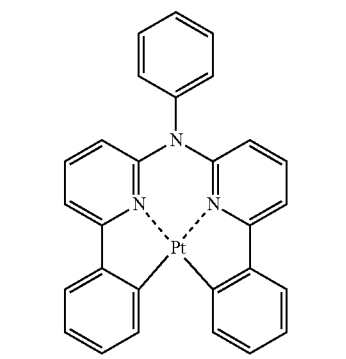
D23
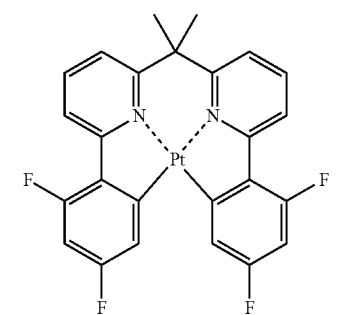

-continued
D24 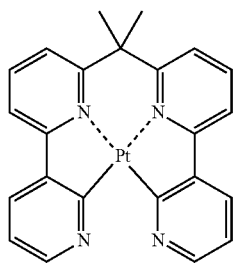
D25 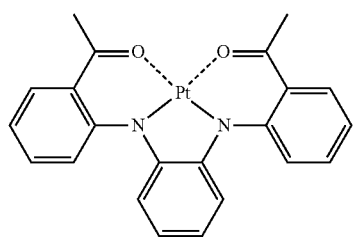
D26 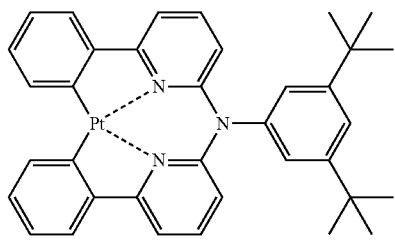
D27 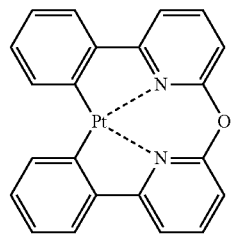
D28 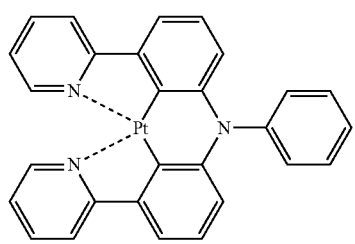
D29 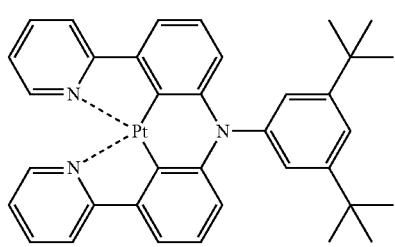
-continued
D30 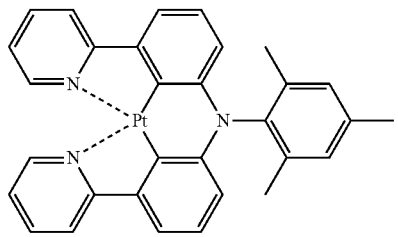
D31 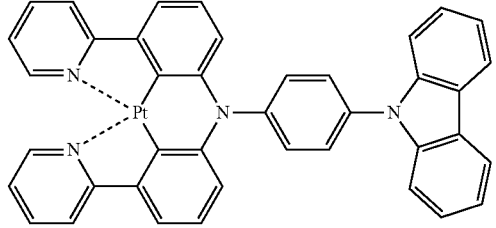
D32 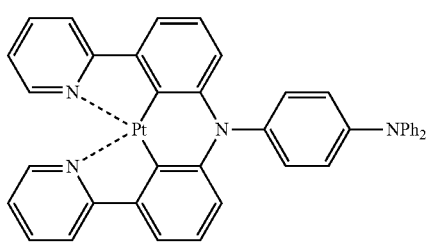
D33 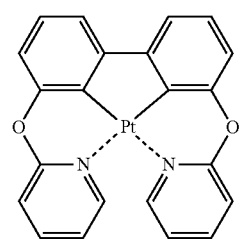
D34 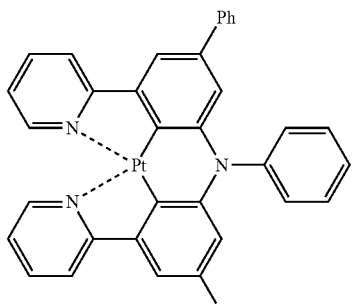
D35 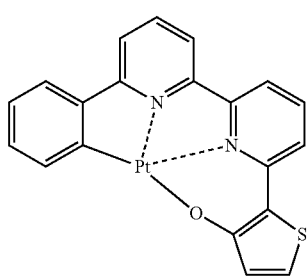

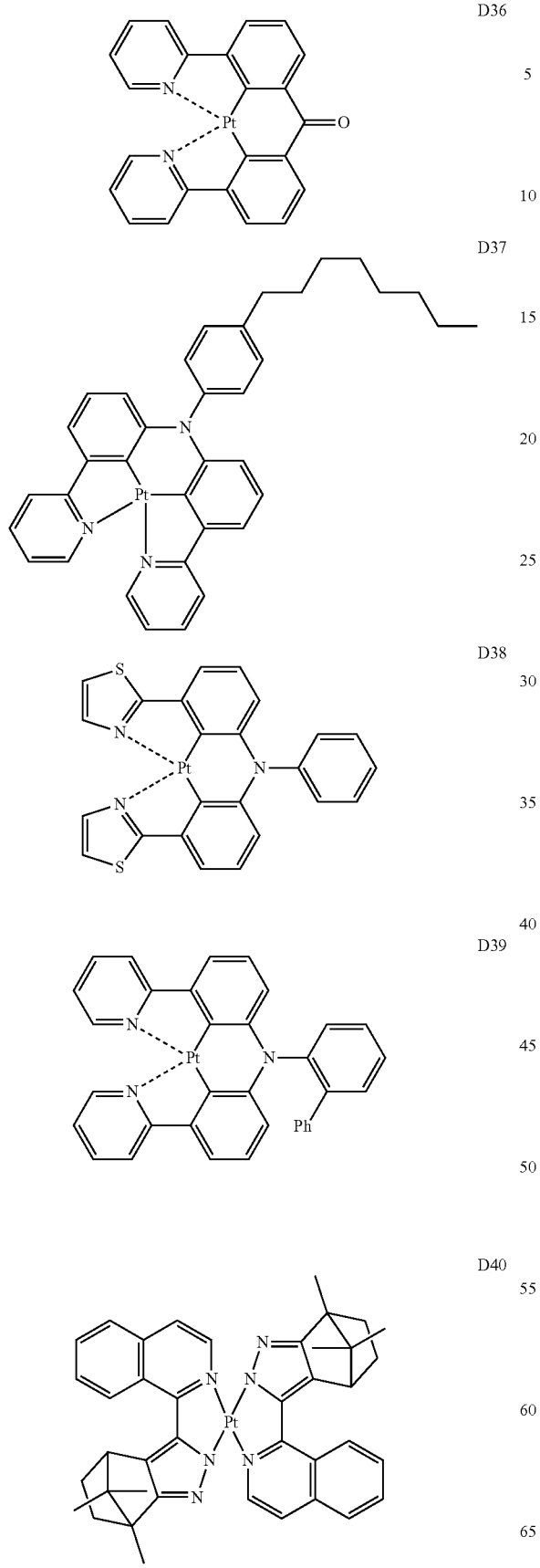
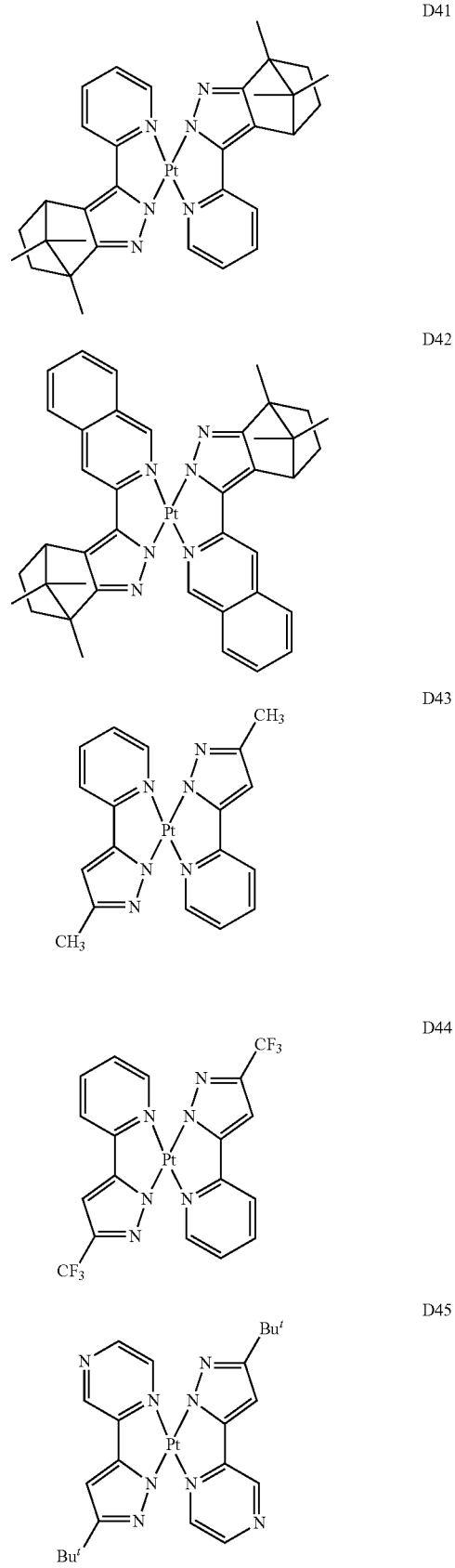

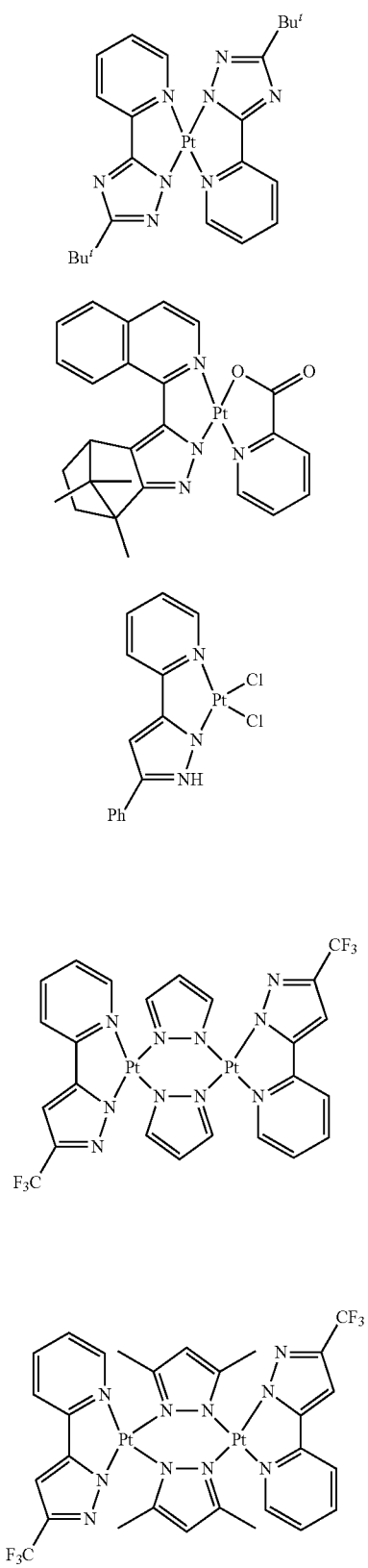

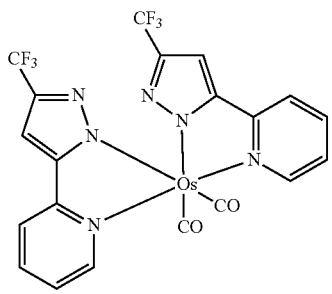

Os(fppz)₂(CO)₂

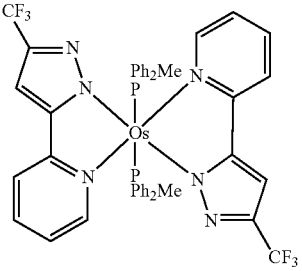

Os(fppz)₂(PPh₂Me)₂

Os(bppz)₂(PPh₃)₂

Os(fptz)₂(PPh₂Me)₂

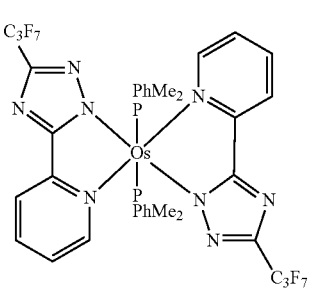

Os(hptz)₂(PPhMe₂)₂

Also, another example of the dopant included in the EML is a Os-complex below, but the dopant is not limited thereto:

When the EML includes a host and a dopant, the amount of the dopant may be about 0.01 to about 15 parts by weight based on about 100 parts by weight of the host. However, the amount of the dopant is not limited thereto.

The thickness of the EML may be about 100 Å to about 10,000 Å, for example, about 200 Å to about 600 Å. If the thickness of the EML is within these ranges, good luminescent characteristics may be obtained without a substantial increase in driving voltage.

Next, an electron transport layer (ETL) is formed on the EML by any one of various methods, for example, vacuum deposition, spin coating, casting, or the like. If the ETL is formed by vacuum deposition or spin coating, the deposition or coating conditions may be similar to those used to form the HIL, although the deposition or coating conditions may vary according to the material that is used to form the ETL.

The material for forming the ETL may be any material that stably transports electrons injected from an electron injection electrode (cathode), and such a material may be the compound according to an embodiment of the present invention or any other suitable electron transportation material.

Non-limiting examples of other suitable electron transportation materials include a quinoline derivative, such as tris(8-quinolinolato)aluminum (Alq3), TAZ, Balq, beryllium bis(benzoquinolin-10-olate) (Bebq$_2$), ADN, Compound 201, and Compound 202.

TAZ

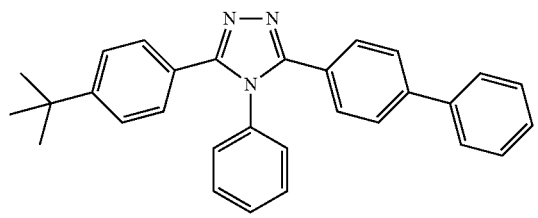

BAlq

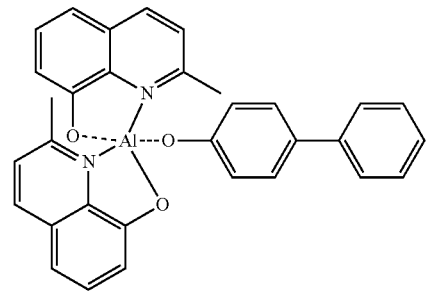

Compound 201

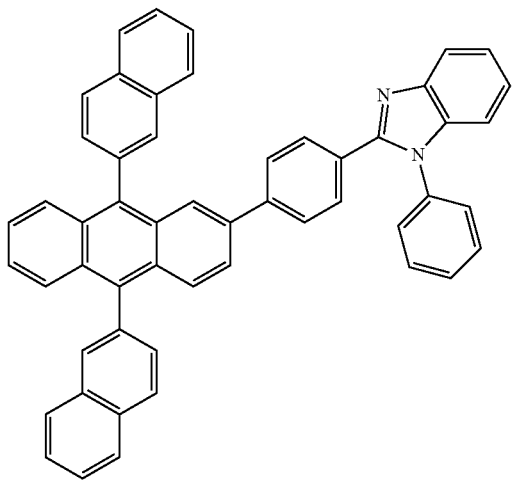

Compound 202

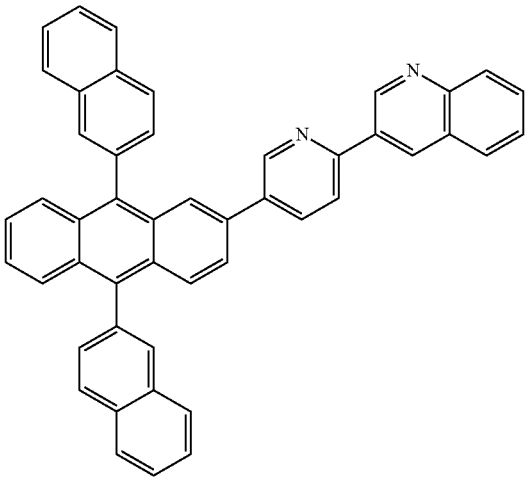

BCP

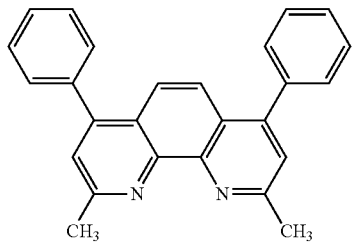

The thickness of the ETL may be about 100 Å to about 1,000 Å, for example, about 150 Å to about 500 Å. When the thickness of the ETL is within these ranges, the ETL may have satisfactory electron transportation characteristics without a substantial increase in driving voltage.

In addition to an electron transporting organic compound, the ETL may include a metal-containing material. The metal-containing material may include a lithium (Li) complex. Non-limiting examples of the Li complex include lithium quinolate (LiQ) and Compound 203 below.

Compound 203

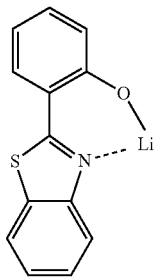

Also, a material that may allow easy injection of electrons from an anode may be deposited on the electron transport layer to form an electron injection layer (EIL). The material of EIL is not particularly limited. The material for forming the EIL may be any one of various suitable materials, including LiF, NaCl, CsF, Li$_2$O, and BaO. The deposition conditions for forming the EIL may vary according to the material that is used to form the EIL, but the conditions may be similar to those used to form the HIL.

The thickness of the EIL may be about 1 Å to about 100 Å, for example, about 3 Å to about 90 Å. When the thickness of the EIL is within these ranges, the EIL may have satisfactory electron transportation characteristics without a substantial increase in a driving voltage.

The second electrode may be disposed on the organic layer. The second electrode may be a cathode, which is an electron injection electrode. The material for forming the second electrode may be a metal, an alloy, an electrically conductive compound, each having a low-work function, or a mixture thereof. For example, lithium (Li), magnesium (Mg), aluminum (Al), aluminum-lithium (Al—Li), calcium (Ca), magnesium-indium (Mg—In), magnesium-silver (Mg—Ag), etc. may be formed as a thin film for use as a transmissive electrode. In some embodiments, to manufacture a top-emission light-emitting device, a transmissive electrode may be formed of indium tin oxide (ITO) or indium zinc oxide (IZO).

The organic light-emitting device according to embodiments of the present invention has been described with reference to FIG. 1, but is not limited thereto.

When the EML includes a phosphorescent dopant, a hole blocking layer (HBL) may be formed between the ETL and the EML or between the E-functional layer and the EML to prevent the diffusion of triplet excitons or holes into the ETL. The HBL may be formed by vacuum deposition, spin coating, casting, LB deposition, etc. When the HBL is formed by vacuum deposition or spin coating, the deposition or coating conditions may be similar to those used to form the HIL, although the deposition or coating conditions may vary according to the material that is used to form the HBL.

The hole blocking material may be any one of various suitable hole blocking materials, non-limiting examples of which include an oxadiazole derivative, a triazole derivative, a phenanthroline derivative, etc. For example, bathocuproine (BCP), shown below, may be used as the hole-blocking material.

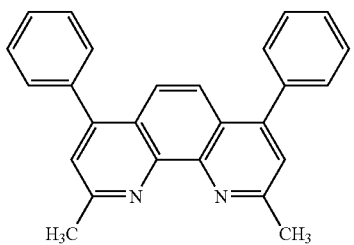

BCP

The thickness of the HBL may be about 20 Å to about 1,000 Å, for example, about 30 Å to about 300 Å. If the thickness of the HBL is within these ranges, good hole blocking properties may be obtained without a substantial increase in driving voltage.

An organic light-emitting device according to an embodiment of the present invention may be included in various flat panel display apparatuses, for example, a passive matrix organic light-emitting display apparatus and an active matrix organic light-emitting display apparatus. In particular, when the organic light-emitting device is included in an active matrix organic light-emitting display apparatus, the first electrode, disposed on a substrate, functions as a pixel and may be electrically connected to a source electrode or a drain electrode of a thin film transistor. In addition, the organic light-emitting device may be included in a flat panel display apparatus that emits light in two opposite directions.

The organic layer of an organic light-emitting device according to an embodiment of the present invention may be formed by depositing a compound according to an embodiment of the present invention, or by coating a solution containing the compound according to an embodiment of the present invention. The latter method is a wet method.

Hereinafter, one or more embodiments of the present invention will be described with reference to the following examples. These examples are presented for illustrative purposes only and are not intended to limit the purpose and scope of the one or more embodiments of the present invention.

EXAMPLES

Synthesis Example 1

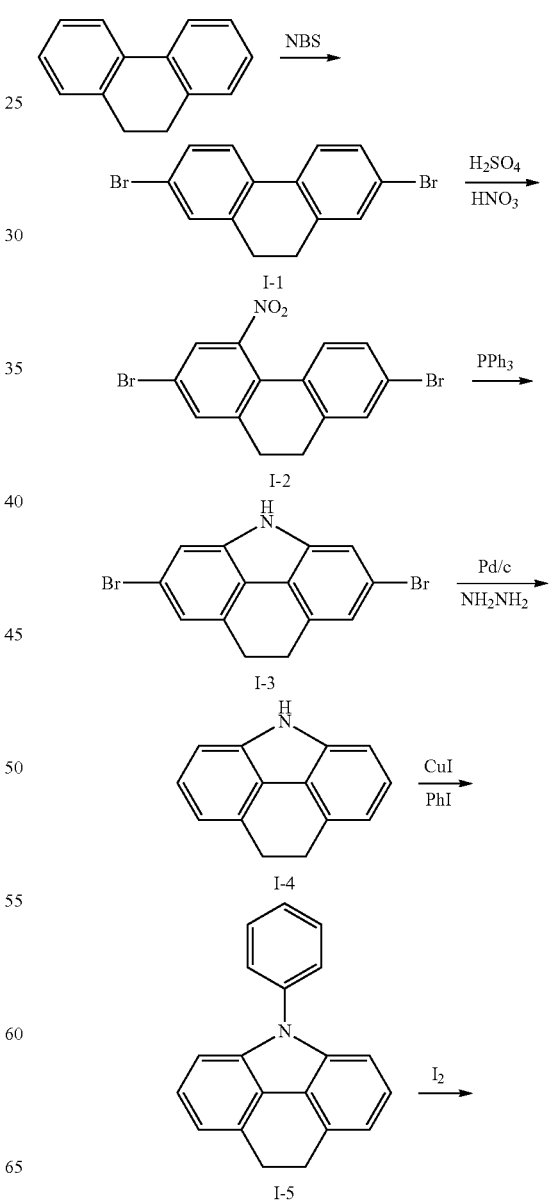

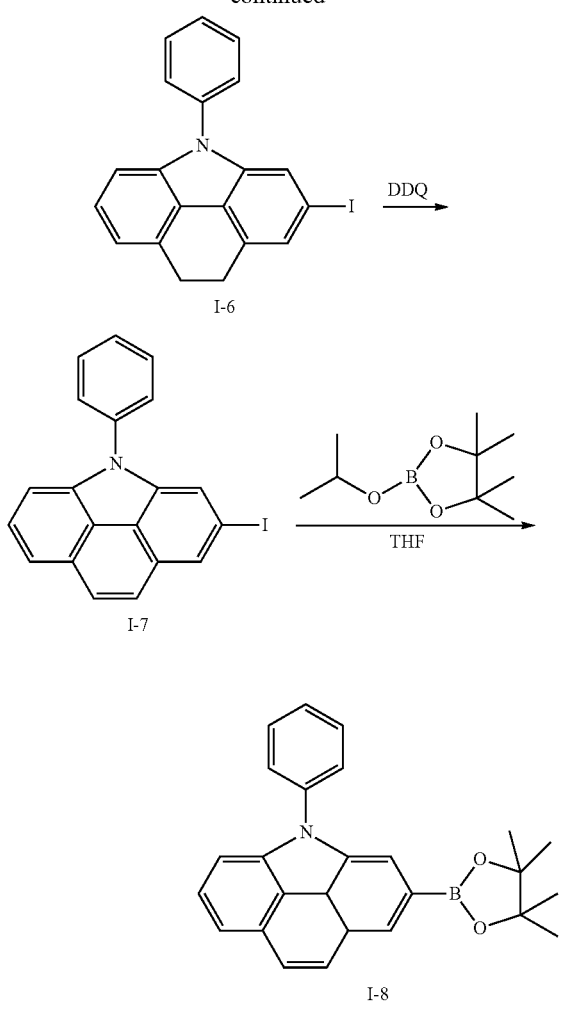
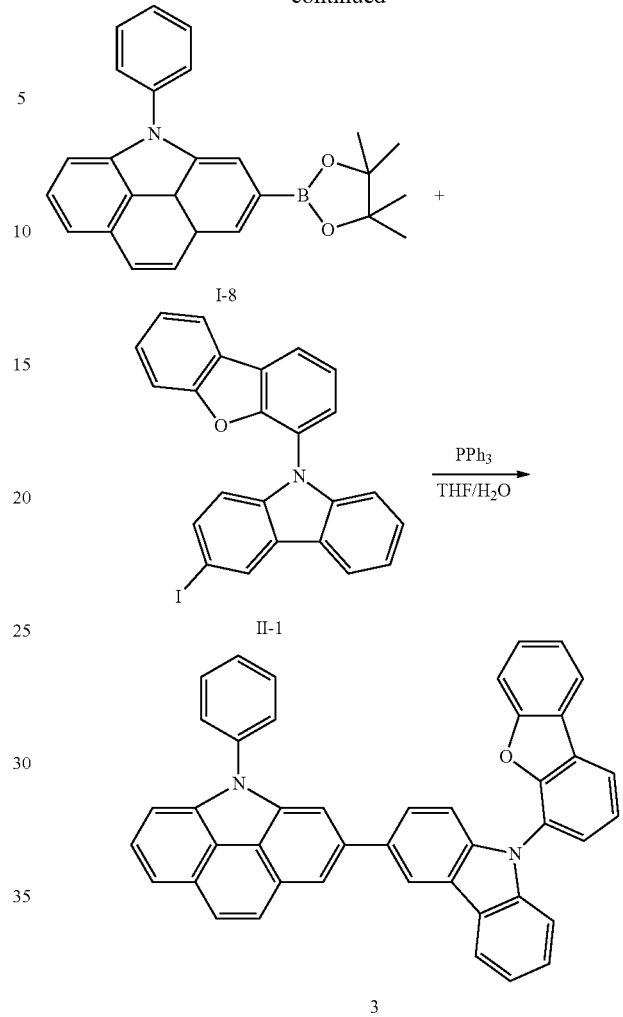
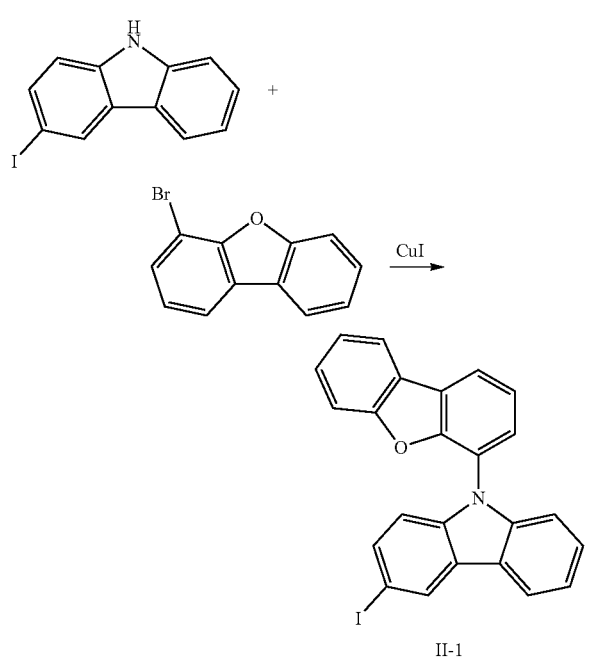

Synthesis of Intermediate I-1

10.0 g (55.4 mmol) of 9,10-dihydrophenanthrene, 21.8 g (121.0 mmol) of N-bromosuccinimide, and 0.5 g (2.7 mmol) of p-TsOH were dissolved in 30 mL of acetonitrile, and then the mixture was stirred at a temperature of 50° C. for 12 hours. The reaction solution was cooled to room temperature, and then stirred for 30 minutes to precipitate crystals. The crystals were collected using a reduced-pressure filter, and then washed with methanol, and 8.4 g (yield: 45%) of Intermediate I-1 was obtained as a gray crystal. The obtained compound was identified by LC-MS. $C_{14}H_{10}Br_2$ M+ 336.9

Synthesis of Intermediate I-2

5.0 g (15.0 mmol) of Intermediate I-1 was completely dissolved in 50 mL of dichloromethane, and 1.7 g (30.0 mmol) of a nitric acid was added thereto at room temperature, and then 1.5 g (15.0 mmol) of a sulfuric acid was slowly added dropwise thereto and the mixture was stirred at a temperature of 30° C. for 6 hours. When the reaction was terminated, the reaction solution was cooled to room temperature, and then 50 mL of methanol was added thereto and the resultant was stirred for 2 hours to precipitate crystals. The crystals were collected using a reduced-pressure filter, and then washed with methanol, and 5.2 g (yield: 90%) of Intermediate I-2 was obtained as a yellow crystal. The obtained compound was identified by LC-MS. $C_{14}H_9Br_2NO_2$ M+ 381.9

Synthesis of Intermediate I-3

4.6 g (12.0 mmol) of Intermediate I-2 was added to 30 mL of o-dichlorobenzene and then completely dissolved by heating, and then 4.7 g (18.0 mmol) of triphenylphosphine was added thereto, and the mixture was stirred at a temperature of 180° C. for 3 hours. The reaction solution was cooled to room temperature, and then the residue obtained by evaporating the solvent was separation-purified by silica gel column chromatography, and then the resultant was washed with methanol to obtain 2.9 g (yield: 70%) of Intermediate I-3, which was a white crystal. The obtained compound was identified by LC-MS. $C_{14}H_9Br_2N$ M+ 349.9

Synthesis of Intermediate I-4

10 g (28.5 mmol) of Intermediate 1-3 and 0.03 g (0.28 mmol) of Pd/C (10%) were dissolved in 100 mL of ethanol at room temperature, and then the temperature of the solution was increased to 50° C. Then, 5.48 g (171 mmol) of hydrazine was added thereto and the mixture was stirred for 24 hours. The reaction solution was cooled to room temperature, washed with acetone, and 100 mL of ice water was added thereto to obtain 3.63 g (yield: 66%) of Intermediate I-4, which was a white crystal. The obtained compound was identified by LC-MS. $C_{14}H_{11}N$ M+ 194.1

Synthesis of Intermediate I-5

1.93 g (10.0 mmol) of Intermediate I-4, 2.5 g (12.0 mmol) of iodobenzene, 0.2 g (1.0 mmol) of 1,10-phenanthroline, 0.2 g (2.0 mmol) of CuI, and 4.1 g (30.0 mmol) of $K_2CO_3$ were dissolved in 30 mL of N,N-dimethylformamide (DMF), and then the mixture was stirred at a temperature of 80° C. for 24 hours. The reaction solution was cooled to room temperature, and then extracted three times with 30 mL of water and 40 mL of diethylether. The collected organic solvent layer was dried using magnesium sulfate, and then the residue obtained by evaporating the solvent was separation-purified by silica gel column chromatography to obtain 2.39 g (yield: 89%) of Intermediate I-5. The obtained compound was identified by LC-MS. $C_{20}H_{15}N$ M+ 270.1

Synthesis of Intermediate I-6

10 g (37.1 mmol) of Intermediate I-5 was completely dissolved in 100 mL of dichloromethane, and 3.58 g (14.1 mmol) of iodine and 2.38 g (11.13 mmol) of $KIO_3$ were each divided into five portions, and each of the portions was added one at a time. The mixture was stirred for 6 hours and washed with methanol to obtain 8.06 g (yield: 55%) of Intermediate I-6. The obtained compound was identified by LC-MS. $C_{20}H_{14}IN$ M+ 396.1

Synthesis of Intermediate I-7

10 g (25.3 mmol) of Intermediate I-6 was dissolved in 100 mL of toluene in an oxygen atmosphere, and then, at room temperature, 1.57 g (7.6 mmol) of 2,3-dichloro-5,6-dicyano-1,4-benzoquinone and 0.52 g (7.6 mmol) of $NaNO_2$ were added thereto, and the mixture was stirred at a temperature of 110° C. for 6 hours. When the reaction was completed, the reaction solution was cooled to room temperature, and the residue obtained by evaporating the solvent was separation-purified by silica gel column chromatography to obtain 8.94 g (yield: 90%) of Intermediate I-7. The obtained compound was identified by LC-MS. $C_{20}H_{12}IN$ M+ 394.0

Synthesis of Intermediate I-8

10 g (25.3 mmol) of Intermediate I-7 was dissolved in 30 ml of THF, and then, at a temperature of −78° C., 10 mL of n-BuLi (25.0 mmol, 2.5M in hexane) was slowly added dropwise thereto. At the same temperature, after the mixture was stirred for one hour, 9.3 mL (50 mmol) of 2-isoproxy-4,4,5,5,-tetramethyl-1,3,2-dioxaborolane was slowly added dropwise thereto. Then, the reaction solution was stirred at a temperature of −78° C. for 1 hour, and then the resultant was additionally stirred for 24 hours at room temperature. When the reaction was terminated, 50 mL of 10% HCl aqueous solution and 50 mL of $H_2O$ were added thereto, and then the resultant was extracted three times with 80 mL of diethylether. The collected organic layer was dried using magnesium sulfate, and then the residue obtained by evaporating the solvent was separation-purified by silica gel column chromatography to obtain 7.49 g (yield: 75%) of Intermediate I-8. The obtained compound was identified by LC-MS. $C_{26}H_{23}BNO_2$: M+ 396.2

Synthesis of Intermediate II-1

2.93 g (10.0 mmol) of 3-iodocarbazole, 2.96 g (12.0 mmol) of 4-bromodibenzofuran, 0.2 g (2.0 mmol) of CuI, and 4.1 g (30.0 mmol) of $K_2CO_3$ were dissolved in 100 mL of N,N-dimethylformamide (DMF), and then the mixture was stirred at a temperature of 80° C. for 24 hours. The reaction solution was cooled to room temperature, and then extracted three times with 30 mL of water and 40 mL of diethylether. The collected organic solvent layer was dried using magnesium sulfate, and then the residue obtained by evaporating the solvent was separation-purified by silica gel column chromatography to obtain 3.21 g (yield: 70%) of Intermediate II-1. The obtained compound was identified by LC-MS. $C_{24}H_{14}INO$ M+ 460.2

Synthesis of Compound 3

1.96 g (5 mmol) of Intermediate I-8, 2.29 g (5 mmol) of Intermediate II-1, 0.289 g (0.25 mmol) of $Pd(PPh_3)_4$ and 0.829 g (6 mmol) of $K_2CO_3$ were dissolved in 100 mL of a $THF/H_2O$ (a volume ratio of 2/1) mixed solution, and then stirred at a temperature of 80° C. for 5 hours. The reaction solution was cooled to room temperature, 40 mL of water was added thereto, and the solution was extracted three times with 50 mL of ethylether. The collected organic layer was dried using magnesium sulfate, and then the residue obtained by evaporating the solvent was separation-purified by silica gel column chromatography to obtain 2.3 g (yield: 68%) of Compound 3. The obtained compound was identified by LC-MS and $^1$H NMR. $C_{44}H_{26}N_2O$ cal. 598.20; found 599.22.

Synthesis Example 2
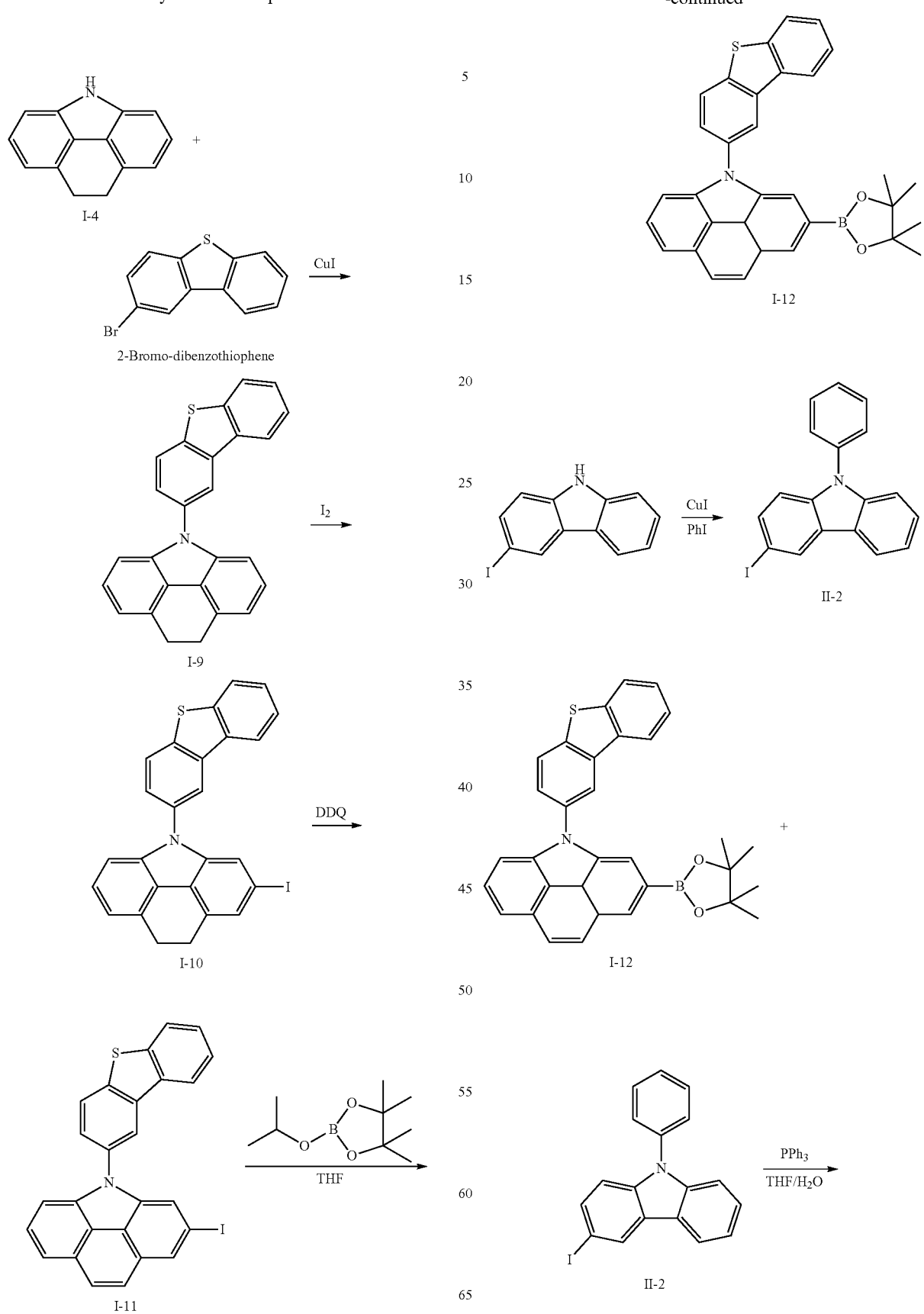

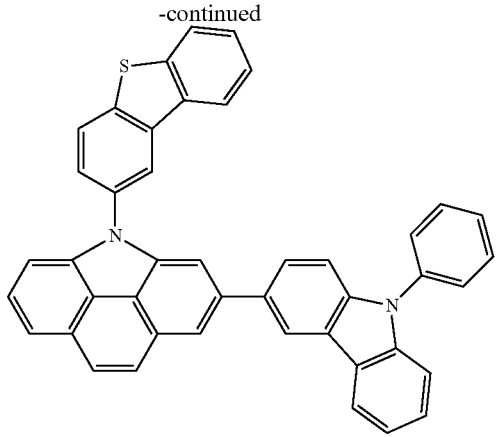

8

Synthesis of Intermediate I-9

Intermediate I-9 was synthesized as in the synthesis of Intermediate I-5, except that 2-bromodibenzothiophene was used instead of iodobenzene. The obtained compound was confirmed by LC-MS. $C_{26}H_{17}NS$ $M^+$ 376.11

Synthesis of Intermediate I-10

Intermediate I-10 was synthesized in the same manner as used to synthesize Intermediate I-6, except that Intermediate I-9 was used instead of Intermediate I-5. The obtained compound was confirmed by LC-MS. $C_{26}H_{16}INS$: $M^+$ 502.12

Synthesis of Intermediate I-11

Intermediate I-11 was synthesized as in the synthesis of Intermediate I-7, except that Intermediate I-10 was used instead of Intermediate I-6. The obtained compound was confirmed by LC-MS. $C_{26}H_{14}INS$: $M^+$ 500.98

Synthesis of Intermediate I-12

Intermediate I-12 was synthesized as in the synthesis of Intermediate I-8, except that Intermediate I-11 was used instead of Intermediate I-7. The obtained compound was confirmed by LC-MS. $C_{32}H_{28}BNO_2S$: $M^+$ 500.20

Synthesis of Intermediate II-2

Intermediate II-2 was synthesized as in the synthesis of Intermediate II-1, except that iodobenzene was used instead of 4-bromodibenzofuran. The obtained compound was confirmed by LC-MS. $C_{24}H_{14}INO$ $M^+$ 460.2

Synthesis of Compound 8

2.62 g (yield: 81%) of Compound 8 was synthesized as in the synthesis of Compound 3, except that Intermediate I-12 was used instead of Intermediate I-8, and Intermediate II-2 was used instead of Intermediate II-1. The obtained compound was confirmed by LC-MS and $^1H$ NMR. $C_{63}H_{39}N_3$ cal. 614.18; found 615.22.

Synthesis Example 3

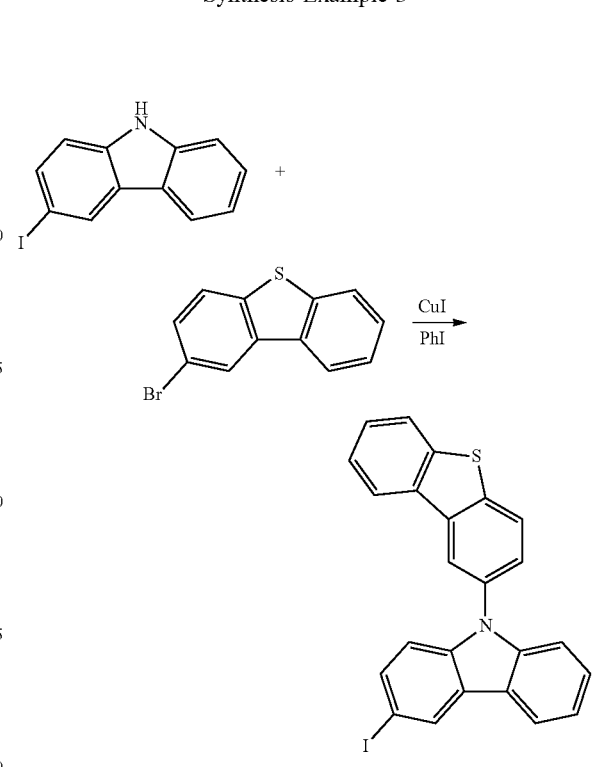

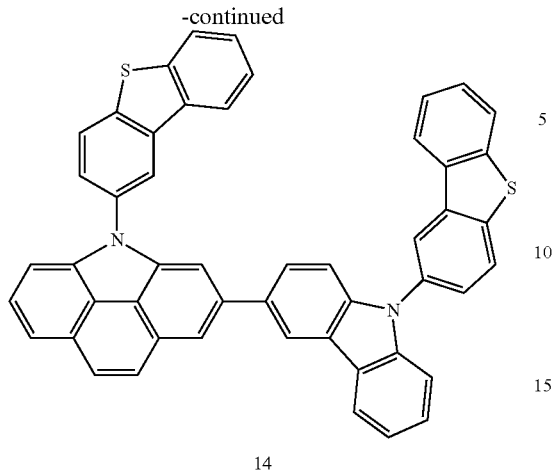

14

Synthesis of Intermediate II-3

Intermediate II-3 was synthesized as in the synthesis of Intermediate II-1, except that 2-bromodibenzothiophene was used instead of 4-bromodibenzofuran. The obtained compound was confirmed by LC-MS. $C_{24}H_{14}INS$ $M^+$ 476.98

Synthesis of Compound 14

2.62 g (yield: 81%) of Compound 14 was synthesized as in the synthesis of Compound 3, except that Intermediate I-12 was used instead of Intermediate I-8, and Intermediate II-3 was used instead of Intermediate II-1. The obtained compound was confirmed by LC-MS and $^1H$ NMR. $C_{50}H_{28}N_2S_2$ cal. 720.17; found 721.44.

Synthesis Example 4

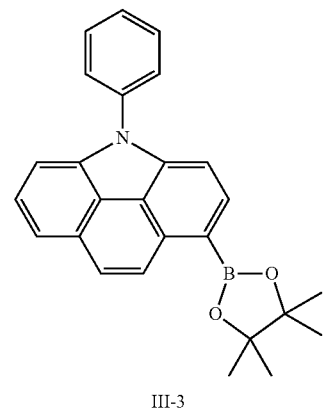

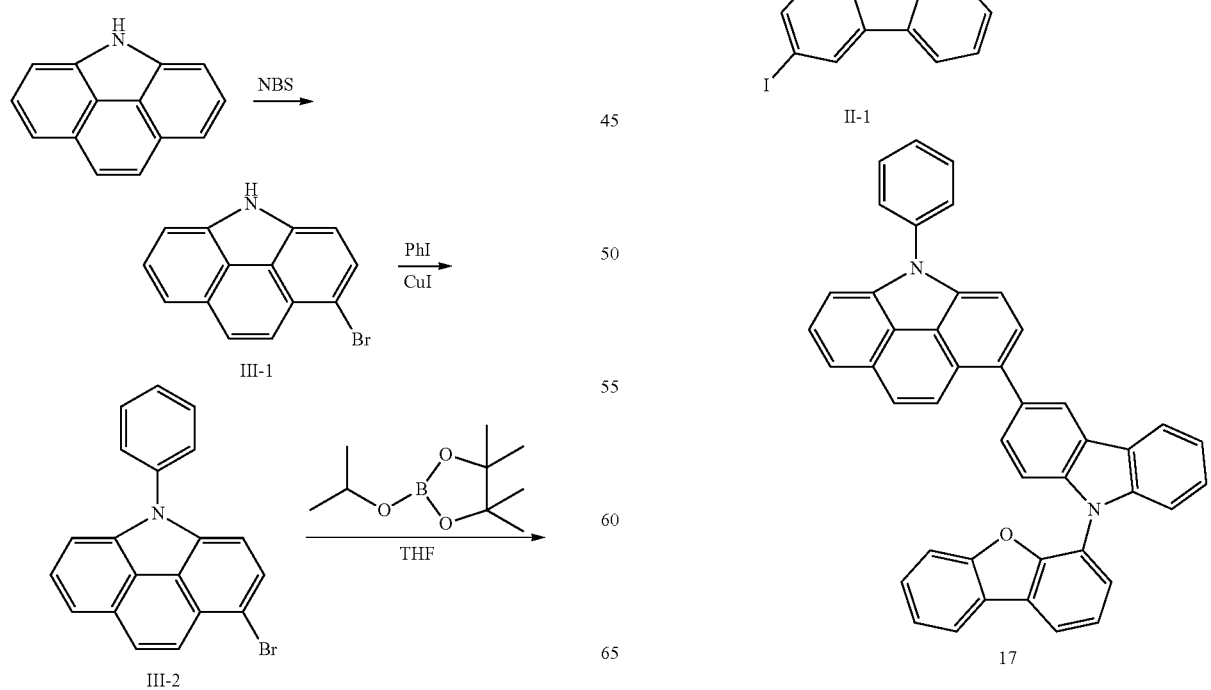

Synthesis of Intermediate III-1

3.82 g (20.0 mmol) of 6H-benzo[def]carbazole was completely dissolved in 200 mL of carbon tetrachloride (CCl$_4$), and 3.56 g (20.0 mmol) of N-bromosuccinimide was added thereto, and then the mixture was stirred at a temperature of 80° C. for 30 minutes. The reaction solution was cooled to room temperature, and then stirred for 30 minutes to precipitate crystals. The crystals were collected using a reduced-pressure filter, and then washed with methanol, and 2.2 g (yield: 45%) of Intermediate III-1 was obtained as a white crystal. The obtained compound was identified by LC-MS. C$_{14}$H$_8$BrN M$^+$ 270.982

Synthesis of Intermediate III-2

Intermediate III-2 was synthesized as in the synthesis of Intermediate I-5, except that Intermediate III-1 was used instead of Intermediate I-4. The obtained compound was identified by LC-MS. C$_{20}$H$_{13}$BrN M$^+$ 346.02

Synthesis of Intermediate III-3

Intermediate III-3 was as in the synthesis of Intermediate I-8, except that Intermediate III-2 was used instead of Intermediate I-7. The obtained compound was identified by LC-MS. C$_{25}$H$_{21}$BrNO$_2$ M$^+$ 379.17

Synthesis of Compound 17

1.91 g (yield: 61%) of Compound 17 was synthesized as in the synthesis of Compound 3, except that Intermediate III-3 was used instead of Intermediate I-8, and Intermediate II-1 was used. The obtained compound was identified by LC-MS and $^1$H NMR. C$_{44}$H$_{26}$N$_2$O cal. 598.20; found 599.22.

Synthesis Example 5

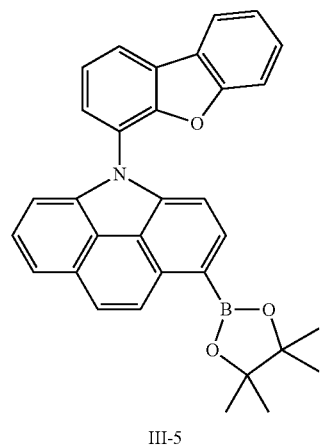

III-5

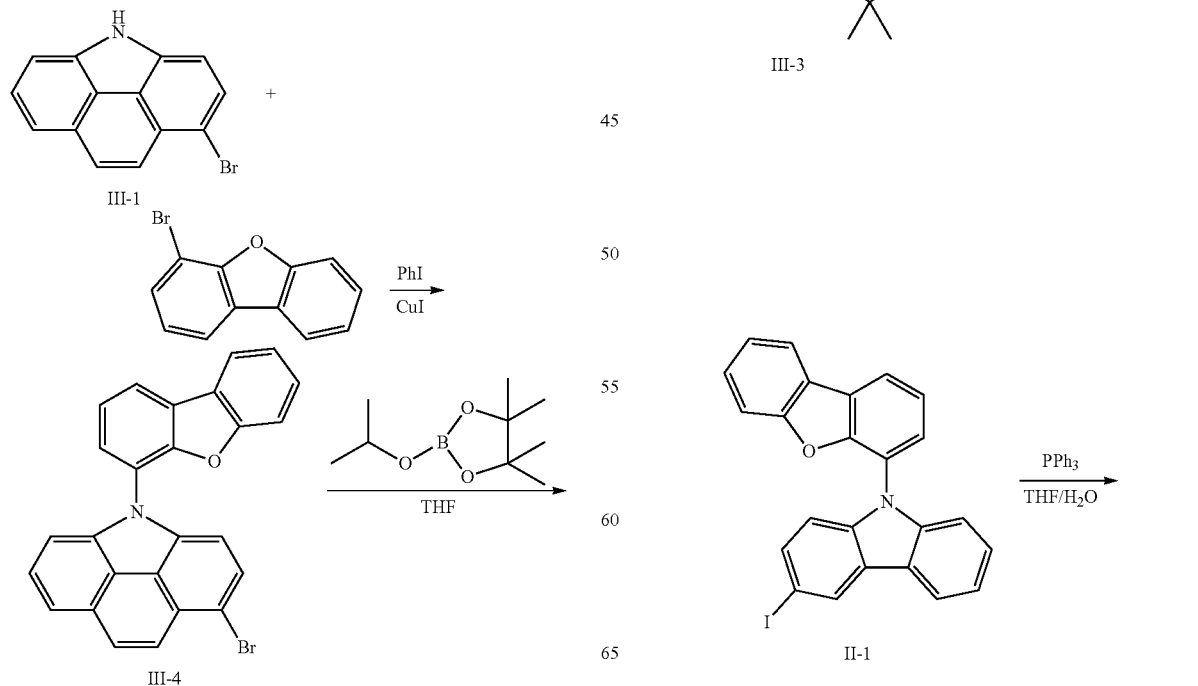

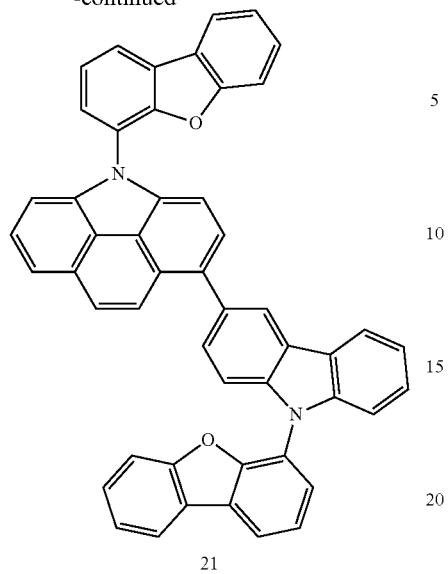

21

Synthesis of Intermediate III-4

Intermediate III-4 was synthesized as in the synthesis of Intermediate I-5, except that Intermediate III-1 was used instead of Intermediate I-4, and 4-dibenzofuran was used instead of iodobenzene. The obtained compound was identified by LC-MS. $C_{26}H_{14}BrNO_2$ $M^+$ 437.02

Synthesis of Intermediate III-5

Intermediate III-5 was synthesized as in the synthesis of Intermediate I-8, except that Intermediate III-4 was used instead of Intermediate I-7. The obtained compound was identified by LC-MS. $C_{32}H_{26}BrNO_3$ $M^+$ 484.20

Synthesis of Compound 21

1.91 g (yield: 61%) of Compound 21 was synthesized as in the synthesis of Compound 3, except that Intermediate III-5 was used instead of Intermediate I-8. The obtained compound was identified by LC-MS and $^1$H NMR. $C_{50}H_{28}N_2O_2$ cal. 688.22; found 689.05.

Synthesis Example 6

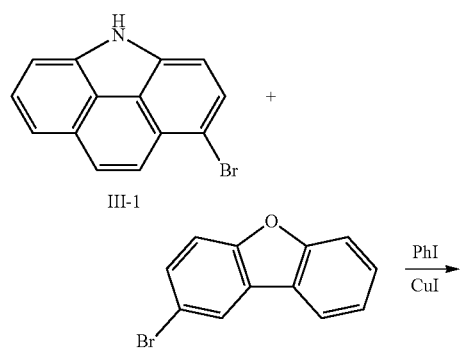

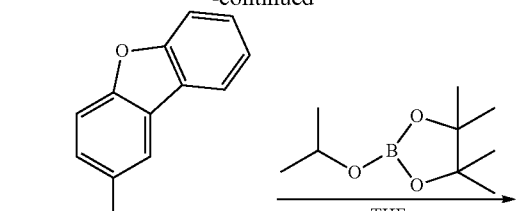

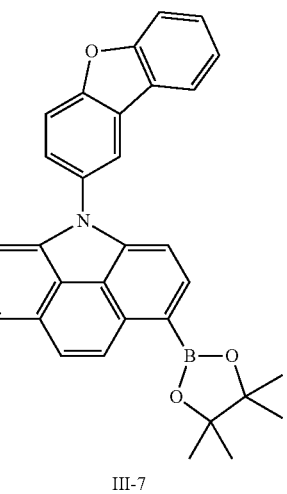

III-7

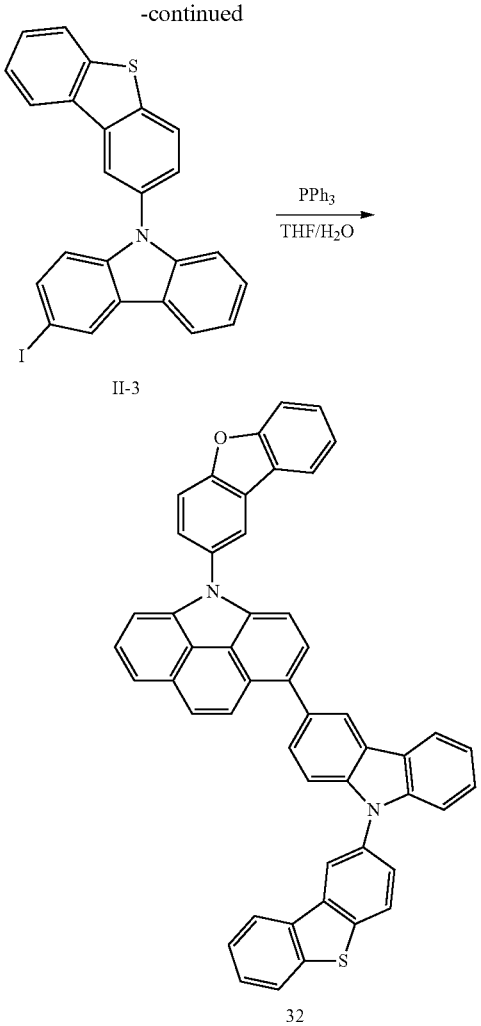

II-3

Synthesis of Intermediate III-6

Intermediate III-6 was synthesized as in the synthesis of Intermediate I-5, except that Intermediate III-1 was used instead of Intermediate I-4, and 2-dibenzofuran was used instead of iodobenzene. The obtained compound was identified by LC-MS. $C_{26}H_{14}BrNO_2$ M+ 437.14

Synthesis of Intermediate III-7

Intermediate III-7 was synthesized as in the synthesis of Intermediate I-8, except that Intermediate III-6 was used instead of Intermediate I-7. The obtained compound was identified by LC-MS. $C_{32}H_{26}BrNO_3$ M+ 484.32

Synthesis of Compound 32

2.78 g (yield: 80%) of Compound 32 was synthesized as in the synthesis of Compound 3, except that Intermediate III-6 was used instead of Intermediate I-8, and Intermediate II-3 instead of Intermediate II-1. The obtained compound was identified by LC-MS and $^1$H NMR. $C_{50}H_{28}N_2O_2$ cal. 704.19; found 705.88.

Additional compounds were synthesized using the same synthesis methods as described above and appropriate intermediate materials (for example, a material having a corresponding I or Br substituent group, and a material having a corresponding —B(OH)$_2$ substituent group). $^1$H NMR and MS/FAB results of the synthetic compounds are shown in Table 1 below.

Methods of synthesizing compounds other than those shown in Table 1 would be discernible to those of ordinary skill in the art by referring to the synthesis paths and source materials described above and in Table 1.

TABLE 1

| Com-pound | $^1$H NMR (CDCl$_3$, 400 MHz) | MS/FAB found | calc. |
|---|---|---|---|
| 1 | δ = 8.25-15 (m, 3H), 8.05-7.95 (m, 2H) 7.90-7.80 (m, 4H), 7.68-7.48 (m, 7H), 7.42-7.30 (m, 9H), 7.28 (dd, 1H) | 599.32 | 598.20 |
| 2 | δ = 8.25-15 (m, 3H), 8.05-8.00 (m, 2H), 7.95-7.85 (m, 4H), 7.75-7.44 (m, 16H), 7.32 (dd, 1H) | 615.22 | 614.18 |
| 3 | δ = 8.20-8.15 (m, 2H), 8.10 (d, 1H), 8.05-7.85 (m, 6H), 7.60-7.35 (m, 16H), 7.30 (t, 1H) | 599.22 | 598.20 |
| 4 | δ = 8.25-15 (m, 3H), 8.05 (dd, 1H), 7.93-7.80 (m, 5H), 7.70-7.46 (m, 17H) | 615.32 | 614.18 |
| 5 | δ = 8.30-8.15 (m, 3H), 8.05-7.80 (m, 6H), 7.75 (d, 1H), 7.70-7.60 (m, 16H), 7.30 (t, 1H) | 599.44 | 598.20 |
| 6 | δ = 8.28-8.17 (m, 3H), 8.08 (dd, 1H), 7.95-7.80 (m, 4H), 7.60-7.32 (m, 18H) | 615.44 | 614.18 |
| 7 | δ = 8.25-8.18 (m, 3H), 8.05-7.90 (m, 5H), 7.80-7.55 (m, 8H), 7.50-7.25 (m, 10H) | 599.44 | 598.20 |
| 8 | δ = 8.28-8.17 (m, 3H), 8.10 (m, 2H), 7.98-7.82 (m, 4H), 7.68-7.38 (m, 17H) | 615.22 | 614.18 |
| 9 | δ = 8.30-8.24 (m, 2H), 8.22 (d, 1H), 8.01-7.96 (m, 3H), 7.84-7.40 (m, 20H), 7.30 (t, 2H) | 689.04 | 688.22 |
| 10 | δ = 8.28-8.17 (m, 3H), 8.12 (dd, 2H), 7.96-7.80 (m, 7H), 7.75-7.45 (m, 16H) | 721.26 | 720.17 |
| 11 | δ = 8.26-8.20 (m, 3H), 8.18 (d, 1H), 8.14 (d, 1H), 8.05--7.90 (m, 8H), 7.85-7.55 (m, 14H), 7.30 (t.1H) | 705.22 | 704.19 |
| 12 | δ = 8.25-8.19 (m, 3H), 8.18 (d, 1H), 8.15 (d, 1H), 8.07--7.91 (m, 8H), 7.86-7.57 (m, 14H), 7.32 (t.1H) | 705.46 | 704.19 |
| 13 | δ = 8.28-8.24 (m, 2H), 8.20 (d, 1H), 8.16-8.10 (m, 4H), 8.06-7.86 (m, 6H), 7.82-7.48 (m, 15H) | 721.46 | 720.17 |
| 14 | δ = 8.26-8.22 (m, 2H), 8.22 (d, 1H), 8.18-8.12 (m, 4H), 8.08-7.90 (m, 6H), 7.84-7.48 (m, 15H) | 721.44 | 720.17 |
| 15 | δ = 8.26-8.22 (m, 2H), 8.20 (d, 1H), 8.16-8.12 (m, 2H), 8.10-7.92 (m, 7H), 7.88-7.50 (m, 14H), 7.44 (dd, 2H) | 704.98 | 704.19 |
| 16 | δ = 8.28-8.22 (m, 2H), 8.18 (d, 1H), 8.16-8.12 (m, 2H), 8.08-7.82 (m, 8H), 7.78-7.42 (m, 15H) | 705.22 | 704.19 |
| 17 | δ = 8.30-8.26 (m, 2H), 8.05 (d, 1H), 8.01-7.93 (m, 6H), 7.90-7.65 (m, 16H), 7.30 (t, 1H) | 599.08 | 598.20 |
| 18 | δ = 8.28-8.22 (m, 2H), 8.18 (d, 1H), 7.98-7.84 (m, 5H), 7.75-7.45 (m, 18H) | 615.48 | 614.18 |
| 19 | δ = 8.26-8.22 (m, 2H), 8.15-8.10 (m, 2H), 8.05-7.96 (m, 5H), 7.92-7.72 (m, 9H), 7.65-7.34 (m, 7H), 7.30 (t, 1H) | 599.86 | 598.20 |
| 20 | δ = 8.29-8.25 (m, 2H), 8.21 (d, 1H), 8.12-7.84 (m, 16H), 7.78-7.52 (m, 7H) | 615.50 | 614.18 |
| 21 | δ = 8.28-8.24 (m, 2H), 8.16-8.08 (m, 10H), 8.00-7.75 (m, 14H), 7.57-7.50 (m, 2H) | 689.05 | 688.22 |
| 22 | δ = 8.28-8.24 (m, 2H), 8.20 (d, 2H), 8.04-7.96 (m, 7H),7.90-7.36 (m, 17H) | 722.01 | 720.17 |
| 23 | δ = 8.30-8.26 (m, 2H), 8.18 (d, 1H), 8.14-8.08 (m, 2H), 8.02-7.84 ( m, 6H), 7.80-7.45 (m, 16H), 7.30 (t, 1H) | 705.22 | 704.19 |
| 24 | δ = 8.28-8.22 (m, 2H), 8.16 (d, 1H), 8.10-7.94 (m, 8H), 7.90-7.65 (m, 16H), 7.28 (t, 1H) | 705.46 | 704.19 |

TABLE 1-continued

| Compound | $^1$H NMR (CDCl$_3$, 400 MHz) | MS/FAB found | calc. |
|---|---|---|---|
| 25 | δ = 8.30-8.26 (m, 2H), 8.20 (d, 1H), 8.16-7.88 (m, 8H), 7.84-7.76 (m, 7H), 7.72-7.50 (m, 8H) | 599.10 | 598.20 |
| 26 | δ = 8.30-8.26 (m, 2H), 8.22 (m, 2H), 8.05-7.88 (m, 6H), 7.80-7.52 (m, 15H), 7.46 (dd, 1H) | 615.43 | 614.18 |
| 27 | δ = 8.28-8.24 (m, 2H), 8.10-7.96 (m, 7H), 7.90-7.68 (m, 9H), 7.58-7.38 (m, 7H), 7.34 (dd, 1H) | 599.99 | 598.20 |
| 28 | δ = 8.28-8.24 (m, 2H), 8.20 (m, 2H), 8.14-7.96 (m, 6H), 7.92-7.54 (m, 15H), 7.50 (dd, 1H) | 615.88 | 614.18 |
| 29 | δ = 8.30-8.26 (m, 2H), 8.00 (dd, 2H), 7.96-7.90 (m, 8H), 7.86-7.60 (m, 7H), 7.45-7.28 (m, 9H) | 690.05 | 688.22 |
| 30 | δ = 8.30-8.26 (m, 2H), 8.18 (m, 4H), 8.00-7.84 (m, 8H), 7.82-7.40 (m, 14H) | 721.56 | 720.17 |
| 31 | δ = 8.30-8.26 (m, 2H), 8.23 (m, 2H), 8.16-7.90 (m, 9H), 7.88-7.50 (m, 14H), 7.44 (dd, 1H) | 705.48 | 704.19 |
| 32 | δ = 8.28-8.24 (m, 2H), 8.20 (m, 2H), 8.14-7.90 (m, 9H), 7.84-7.48 (m, 14H), 7.44 (dd, 1H) | 705.88 | 704.19 |

Example 1

An anode was manufactured as follows. A substrate, on which ITO, Ag, and ITO were respectively deposited to thicknesses of 70 Å, 1000 Å, and 70 Å, was cut to a size of 50 mm×50 mm×0.5 mm, and then sonicated with isopropyl alcohol and pure water each for 5 minutes, and then washed by UV irradiation for 30 minutes and ozone. The resulting glass substrate was loaded in a vacuum deposition apparatus.

2-TNATA was vacuum deposited on the substrate to form a HIL having a thickness of 600 Å, and then, 4,4'-bis[N-(1-naphthyl)-N-phenylamino]biphenyl (NPB), as a hole transportation compound, was vacuum deposited thereon to form a HTL having a thickness of 1000 Å.

Compound 3 according to an embodiment of the present invention as a green phosphorescent host, and Ir(ppy)3 as a dopant, were co-deposited on the HTL at a weight ratio of 91 to 9 to form an EML having a thickness of 250 Å. Then, BCP as a hole blocking compound, was vacuum deposited on the EML to form a HBL having a thickness of 50 Å to form a hole blocking layer. Subsequently, Alq3 was deposited thereon to form an ETL having a thickness of 350 Å, and then LiF (which is a halogenated alkali metal) was deposited on the ETL to form an EIL having a thickness of 10 Å, and Mg and Ag were deposited at weight ratio of 90 to 10 to a thickness of 120 Å to form an electrode, thereby completing the manufacture of an organic electroluminescent light-emitting device.

At a current density of 10 mA/cm$^2$, the device had a driving voltage of 5.4 V, a luminescence brightness of 4,852 cd/m$^2$, a luminescence efficiency of 48.5 cd/A, and a half-lifespan (hr @100 mA/cm$^2$) of 69 hours.

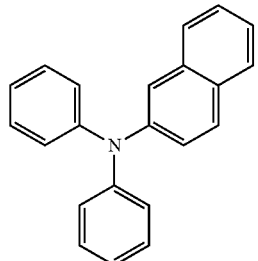

2-TNATA

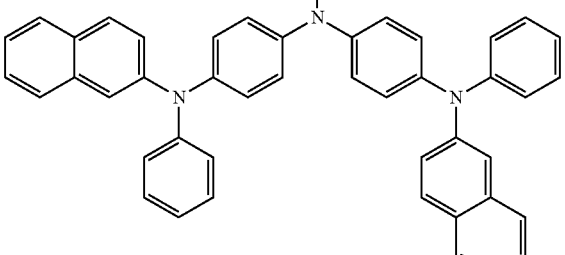

IIPB

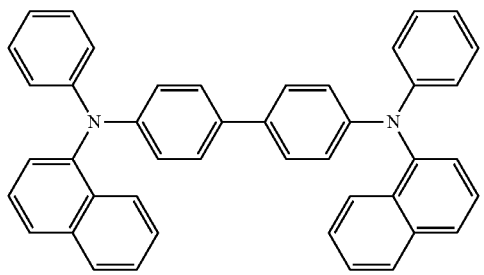

3

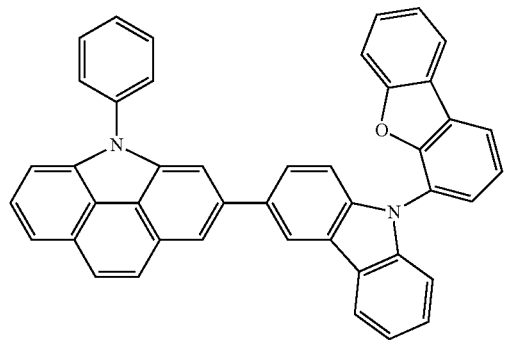

Ir(ppy)$_3$

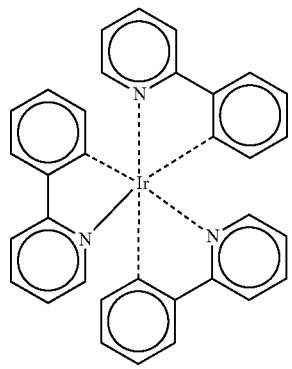

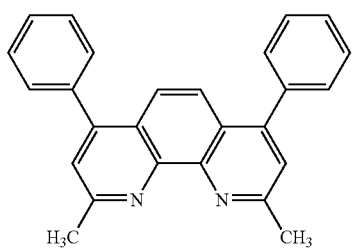
BCP

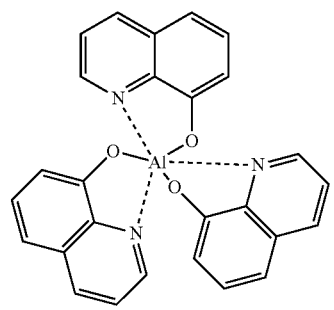
Alq₃

Example 2

An organic EL device was manufactured as in Example 1, except that in forming the EML, Compound 8 was used instead of Compound 3.

At a current density of 10 mA/cm², the device had a driving voltage of 5.3 V, a luminescence brightness of 4,978 cd/m², a luminescence efficiency of 49.8 cd/A, and a half-lifespan (hr@100 mA/cm²) of 67 hours.

Example 3

An organic EL device was manufactured as in Example 1, except that in forming the EML, Compound 17 was used instead of Compound 3.

Ata current density of 10 mA/cm², the device had a driving voltage of 5.2 V, a luminescence brightness of 5,234 cd/m², a luminescence efficiency of 52.3 cd/A, and a half-lifespan (hr@100 mA/cm²) of 74 hours.

Example 4

An organic EL device was manufactured as in Example 1, except that in forming the EML, Compound 21 was used instead of Compound 3.

At a current density of 10 mA/cm², the device had a driving voltage of 5.3 V, a luminescence brightness of 5,534 cd/m², a luminescence efficiency of 55.3 cd/A, and a half-lifespan (hr@100 mA/cm²) of 98 hours.

Example 5

An organic EL device was manufactured as in Example 1, except that in forming the EML, Compound 32 was used instead of Compound 3.

At a current density of 10 mA/cm², the device had a driving voltage of 5.4 V, a luminescence brightness of 5,013 cd/m², a luminescence efficiency of 50.1 cd/A, and a half-lifespan (hr@100 mA/cm²) of 88 hours.

Example 6

An organic EL device was manufactured as in Example 1, except that in forming the ETL, Compound 14 was used instead of Alq₃.

At a current density of 10 mA/cm², the device had a driving voltage of 5.1 V, a luminescence brightness of 5,133 cd/m², a luminescence efficiency of 51.3 cd/A, and a half-lifespan (hr@100 mA/cm²) of 104 hours.

Comparative Example 1

An organic EL device was manufactured as in Example 1, except that in forming the EML, 4,4'-N,N'-dicarbazolylbiphenyl (CBP), which is a green phosphorescent host, was used instead of Compound 3.

At a current density of 10 mA/cm², the device had a driving voltage of 6.5 V, a luminescence brightness of 3,210 cd/m², a luminescence efficiency of 32.1 cd/A, and a half-lifespan (hr@100 mA/cm²) of 32 hours.

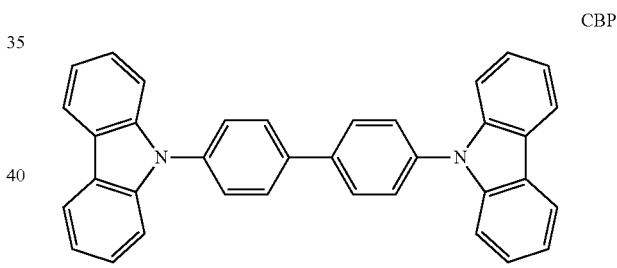
CBP

Compounds represented by Formula 1 were used as host materials for green and red phosphorescent EMLs or as electron transporting materials. When compared with CBP, the compounds represented by Formula 1 showed high driving voltages, high efficiency, and good I-V-L characteristics. In particular, the compounds represented by Formula 1 showed improved lifespan characteristics, exhibiting substantially prolonged lifespans. Representative characteristics and lifespan results were measured and the results are shown in Table 2.

TABLE 2

|  | EML host or ETL | Driving Voltage (V) | Current Density (mA/cm²) | Brightness (cd/m²) | Efficiency (cd/A) | Emission Color | Lifespan LT97 (hr) |
|---|---|---|---|---|---|---|---|
| Example 1 | Compound 3 | 5.4 | 10 | 4,852 | 48.5 | Green | 69 hr |
| Example 2 | Compound 8 | 5.3 | 10 | 4,978 | 49.8 | Green | 67 hr |
| Example 3 | Compound 17 | 5.2 | 10 | 5,234 | 52.3 | Green | 74 hr |

TABLE 2-continued

|  | EML host or ETL | Driving Voltage (V) | Current Density (mA/cm²) | Brightness (cd/m²) | Efficiency (cd/A) | Emission Color | Lifespan LT97 (hr) |
|---|---|---|---|---|---|---|---|
| Example 4 | Compound 21 | 5.3 | 10 | 5,534 | 55.3 | Green | 98 hr |
| Example 5 | Compound 32 | 5.4 | 10 | 5,013 | 50.1 | Green | 88 hr |
| Example 6 | Compound 14 | 5.1 | 10 | 5,133 | 51.3 | Green | 104 hr |
| Comparative Example 1 | CBP | 6.5 | 10 | 3,210 | 32.1 | Green | 32 hr |

The heterocyclic compounds represented by Formula 1 have good charge transporting capabilities, and thus are suitable for use as light-emitting materials or as electron transporting materials for full color (such as red, green, blue, or white) fluorescent and phosphorescent devices. Accordingly, by including the heterocyclic material, organic light-emitting devices having high efficiency, low voltages, high brightness, and long lifespans may be manufactured.

While certain exemplary embodiments have been described herein, those of ordinary skill in the art will recognize that various changes can be made to the described embodiments without departing from the spirit and scope of the present invention, as defined in the following claims. As such, the described embodiments should be considered in a descriptive sense only and not for purposes of limitation, and descriptions of features or aspects within each embodiment should typically be considered as available for other similar features or aspects in other embodiments.

What is claimed is:

1. A heterocyclic compound represented by Formula 1:

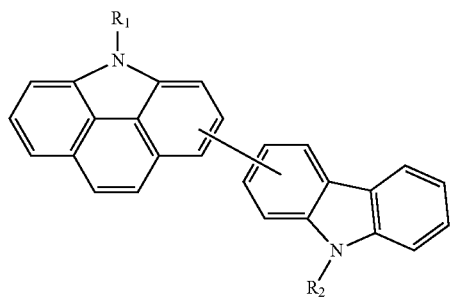

Formula 1 wherein:
$R_1$ and $R_2$ are each independently a substituted or unsubstituted C1-C60 alkyl group, a substituted or unsubstituted C6-C60 aryl group, a substituted or unsubstituted C2-C60 heteroaryl group that is not pyrimidine or 1,3,5-triazine, or a substituted or unsubstituted C6-C60 condensed polycyclic group;

at least one of $R_1$ and $R_2$ is a heterocyclic compound represented by Formula 2:

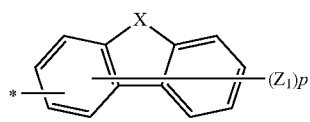

Formula 2 wherein:
X is O, S, or Se;
$Z_1$ is a hydrogen atom, a deuterium atom, a substituted or unsubstituted C1-C20 alkyl group, a C1-C20 alkylsilyl group, a C6-C20 arylsilyl group, a substituted or unsubstituted C6-C20 aryl group, a substituted or unsubstituted C2-C20 heteroaryl group, a substituted or unsubstituted C6-C20 condensed polycyclic group, a halogen group, a cyano group, a nitro group, a hydroxyl group, a carboxyl group, or an amino group substituted with a C6-C20 aryl group or a C2-C20 heteroaryl group;
p is an integer of 1 to 7; and
* indicates a binding site.

2. The heterocyclic compound of claim 1, wherein the heterocyclic compound of Formula 1 is represented by Formula 3:

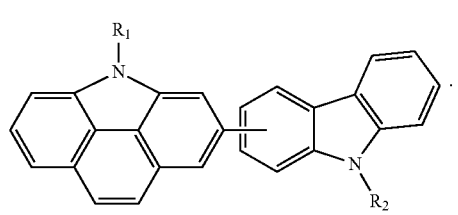

Formula 3

3. The heterocyclic compound of claim 1, wherein the heterocyclic compound of Formula 1 is represented by Formula 4:

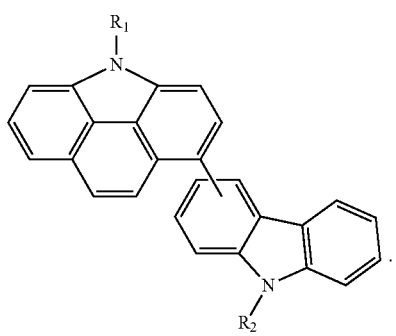

Formula 4

4. The heterocyclic compound of claim 1, wherein when one of $R_1$ and $R_2$ in Formula 1 is the heterocyclic compound of Formula 2, the other of $R_1$ and $R_2$ is represented by Formula 2a:

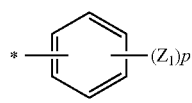

2a wherein:

$Z_1$ is a hydrogen atom, a deuterium atom, a substituted or unsubstituted C1-C20 alkyl group, a C1-C20 alkylsilyl group, a C1-C20 arylsilyl, a substituted or unsubstituted C6-C20 aryl group, a substituted or unsubstituted C2-C20 heteroaryl group, a substituted or unsubstituted C6-C20 condensed polycyclic group, a halogen group, a cyano group, a nitro group, a hydroxyl group, a carboxyl group, or an amino group substituted with a C6-C20 aryl group or a C2-C20 heteroaryl group;

p is an integer of 1 to 5; and

* indicates a binding site.

5. The heterocyclic compound of claim 1, wherein $Z_1$ in Formula 2 is a hydrogen atom or a deuterium atom.

6. The heterocyclic compound of claim 4, wherein $Z_1$ in Formula 2a is a hydrogen atom or a deuterium atom.

7. The heterocyclic compound of claim 1, wherein the compound of Formula 1 is one of Compounds 3, 8, 14, 17, 21 or 32:

3

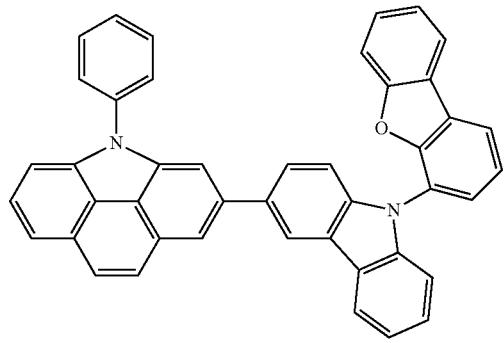

8

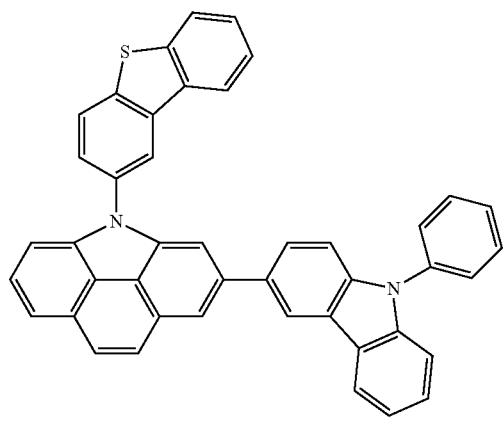

14

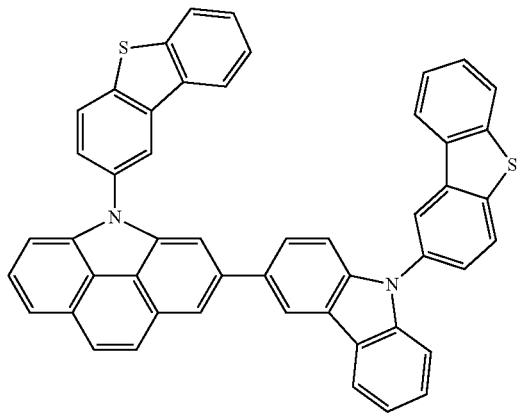

17

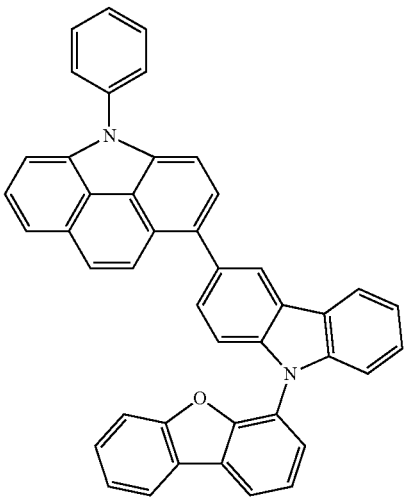

21

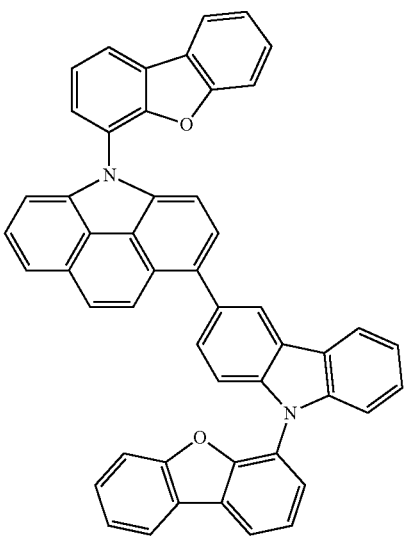

-continued

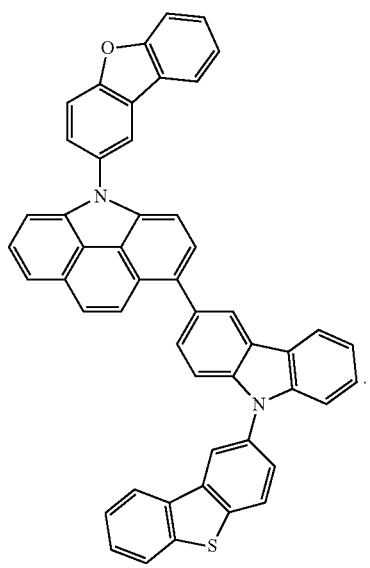

32

8. An organic light-emitting device (OLED) comprising:
a first electrode;
a second electrode; and
an organic layer between the first electrode and the second electrode,
wherein the organic layer comprises the compound of claim 1.

9. The OLED of claim 8, wherein the organic layer is an emission layer or an electron transport layer.

10. The OLED of claim 8, wherein:
the organic layer includes one or more of an emission layer, an electron injection layer, an electron transport layer, a functional layer having electron injection capability and electron transportation capability, a hole injection layer, a hole transport layer, or a functional layer having hole injection capability and hole transportation capability, and
the emission layer includes an anthracene-based compound, an arylamine-based compound, or a styryl-based compound.

11. The organic light-emitting device of claim 8, wherein the organic layer includes one or more of an emission layer, an electron injection layer, an electron transport layer, a functional layer having electron injection capability and electron transportation capability, a hole injection layer, a hole transport layer, or a functional layer having hole injection capability and hole transportation capability, and
the emission layer includes a red layer, a green layer, a blue layer, and a white layer, one of which includes a phosphorescent compound.

12. The OLED of claim 11, wherein the hole injection layer, the hole transport layer, or the functional layer having hole injection capability and hole transport capability includes a charge-generation material.

13. The OLED of claim 12, wherein the charge-generation material is a p-dopant.

14. The OLED of claim 13, wherein the p-dopant is a quinone derivative.

15. The OLED of claim 13, wherein the p-dopant is a metal oxide.

16. The OLED of claim 13, wherein the p-dopant is a compound containing a cyano group.

17. The OLED of claim 8, wherein the organic layer includes an electron transport layer, and the electron transport layer comprises a metal complex.

18. The OLED of claim 17, wherein the metal complex is a Li-complex.

19. The OLED of claim 8, wherein the organic layer is formed by a wet process using the compound of Formula 1.

20. A flat display apparatus, comprising the OLED of claim 8, wherein the first electrode of the organic light-emitting device is electrically connected to a source electrode or a drain electrode of a thin film transistor.

* * * * *